United States Patent
Walsh et al.

(10) Patent No.: US 9,607,708 B2
(45) Date of Patent: Mar. 28, 2017

(54) VOLTAGE MODE SENSING FOR LOW POWER FLASH MEMORY

(71) Applicant: Medtronic, Inc., Minneapolis, MN (US)

(72) Inventors: Kevin K. Walsh, Peoria, AZ (US);
Paul B. Patterson, Gilbert, AZ (US);
Glen W. Benton, Chandler, AZ (US);
Jeffrey D. Wilkinson, Vadnais Heights, MN (US)

(73) Assignee: Medtronic, Inc., Minneapolis, MN (US)

( * ) Notice: Subject to any disclaimer, the term of this patent is extended or adjusted under 35 U.S.C. 154(b) by 441 days.

(21) Appl. No.: 13/665,409

(22) Filed: Oct. 31, 2012

(65) Prior Publication Data
US 2013/0235663 A1 Sep. 12, 2013

Related U.S. Application Data

(60) Provisional application No. 61/607,992, filed on Mar. 7, 2012.

(51) Int. Cl.
| | |
|---|---|
| G11C 16/30 | (2006.01) |
| G11C 7/06 | (2006.01) |
| G11C 7/08 | (2006.01) |
| G11C 7/22 | (2006.01) |
| G11C 16/26 | (2006.01) |
| G11C 16/28 | (2006.01) |
| G11C 7/14 | (2006.01) |

(Continued)

(52) U.S. Cl.
CPC ............ *G11C 16/30* (2013.01); *G11C 7/065* (2013.01); *G11C 7/08* (2013.01); *G11C 7/227* (2013.01); *G11C 16/26* (2013.01); *G11C 16/28* (2013.01); *G11C 7/14* (2013.01); *G11C 11/005* (2013.01); *G11C 17/12* (2013.01); *G11C 29/50* (2013.01); *G11C 29/50004* (2013.01)

(58) Field of Classification Search
CPC .. G11C 7/12; G11C 7/14; G11C 16/28; G11C 29/50
USPC .......................... 365/185.18, 185.21, 185.23
See application file for complete search history.

(56) References Cited

U.S. PATENT DOCUMENTS

| | | | |
|---|---|---|---|
| 4,184,207 | A | 1/1980 | McElroy |
| 4,654,831 | A | 3/1987 | Venkatesh |

(Continued)

FOREIGN PATENT DOCUMENTS

| | | |
|---|---|---|
| CN | 1677572 A | 10/2005 |
| TW | 200629063 A | 8/2006 |

OTHER PUBLICATIONS

Mamidipaka et al., "Leakage Power Estimation in SRAMs", CECS Technical Report #03-32, Center for Embedded Computer Systems, University of California, Irvine, CA Sep. 1, 2003.

(Continued)

*Primary Examiner* — Douglas King
(74) *Attorney, Agent, or Firm* — Scott A. Bardell

(57) ABSTRACT

Electrically erasable flash memory and method. The memory has a data storage element and a voltage sensing circuit. The data storage element is configured to store data bits, each of the data bits having a data state. The voltage sensing circuit is selectively coupled to individual ones of data bits and is configured to bias the data bits with at least one of a bias current and a bias resistance and to read the data state of the individual ones of the plurality of data bits.

28 Claims, 18 Drawing Sheets

(51) Int. Cl.
*G11C 11/00* (2006.01)
*G11C 17/12* (2006.01)
*G11C 29/50* (2006.01)

(56) References Cited

U.S. PATENT DOCUMENTS

| | | | |
|---|---|---|---|
| 5,168,466 A * | 12/1992 | Kuo et al. | 365/185.21 |
| 5,862,074 A * | 1/1999 | Park | 365/185.03 |
| 6,259,627 B1 * | 7/2001 | Wong | 365/185.21 |
| 7,031,188 B2 | 4/2006 | Lee et al. | |
| 7,369,438 B2 | 5/2008 | Lee | |
| 7,535,766 B2 | 5/2009 | Ito | |
| 7,684,262 B2 | 3/2010 | Zampaglione et al. | |
| 7,692,964 B1 | 4/2010 | Sabharwal et al. | |
| 2002/0181284 A1 | 12/2002 | Kato | |
| 2003/0048665 A1 | 3/2003 | Thomsen | |
| 2003/0161184 A1 | 8/2003 | Lee et al. | |
| 2004/0120193 A1 | 6/2004 | Nakaya | |
| 2005/0169078 A1 | 8/2005 | Balasubramanian et al. | |
| 2005/0201169 A1 | 9/2005 | Demange et al. | |
| 2012/0262993 A1 * | 10/2012 | Moschiano et al. | 365/185.21 |

OTHER PUBLICATIONS

Qin et al., "SRAM Leakage Suppression by Minimizing Standby Supply Voltage", Power Point Presentation, Berkley Wireless Research Center, ISQED 2004, pp. 1-19.
(PCT/US2013/028517) PCT Notification of Transmittal of the International Search Report and the Written Opinion of the International Searching Authority, Mailed Jul. 3, 2013, 12 pages.
(PCT/US2013/028819) PCT Notification of Transmittal of the International Search Report and the Written Opinion of the International Searching Authority, Mailed Jul. 3, 2013, 10 pages.

* cited by examiner

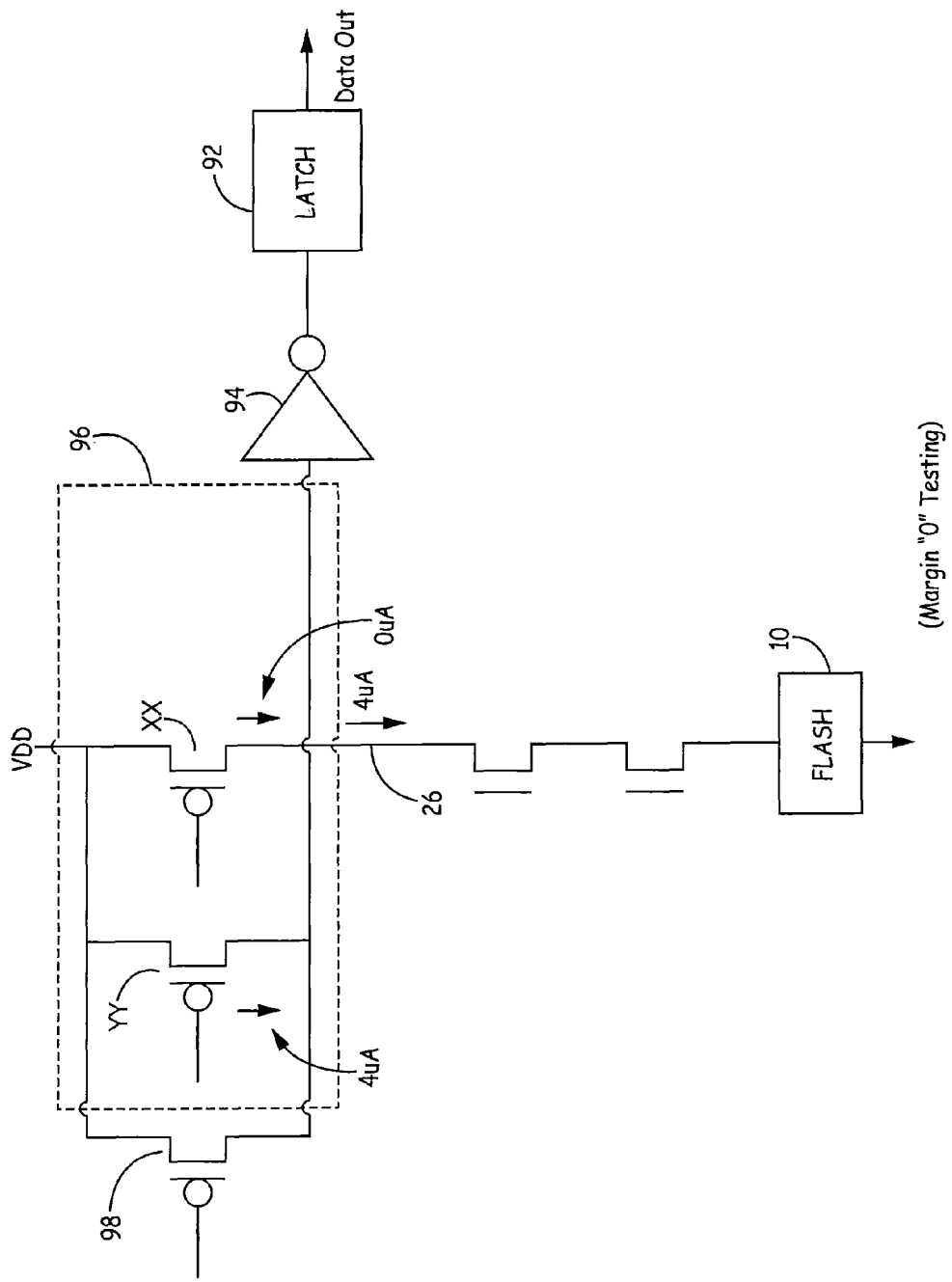

VOLTAGE MODE SENSING FOR LOW POWER FLASH MEMORY

FIELD

The present invention relates generally to memory arrays and, in particular, to memory modules incorporating both flash memory and ROM memory cells with common addressing circuitry.

BACKGROUND

In contrast with volatile data bits, non-volatile data bits maintain stored digital data for relatively extended periods of time without need to maintain power to the data bit. Such non-volatile data bits include read-only data bits, made from various semiconductor devices and known in the art as ROM, and flash data bits, traditionally made from floating-gate transistors. Such non-volatile data bits are electrically addressed and thus are faster to access than, for instance, mechanically addressed data storage systems such as magnetic storage (for instance, hard disks) and optical storage (for instance, CD-ROMs). However, non-volatile data bits have historically contrasted unfavorably with volatile memory and mechanically addressed data storage in terms of cost, efficiency and utility. While both volatile and mechanically addressed storage is relatively cheap to produce, densely packed and freely writeable and rewriteable, non-volatile memory has historically been expensive, large and with limitations on how many times the cell may be written to, as with a flash data bit, or not subject to being rewritten at all, as with ROM cells.

Recent developments in the technology and production of flash cells, however, have begun to make flash memory relatively cost effective for various common applications. In applications accustomed to the use of relatively high-power consumption volatile memory, the use of flash memory in and of itself may produce considerable power savings over volatile memory. However, particularly in applications which rely on low power consumption, the use of flash cells may nevertheless produce undesirably high power consumption.

In part, the power consumption of flash memory systems derives not only from the individual flash data bits themselves which comprise the array but also from the infrastructure built around the individual cells which permit the reading and writing of data to the cells. In particular, and as is well known in the art, the operation by which the contents of a flash data bit are read involves biasing the cell with a voltage and sensing the impact of the cell current. On the basis of an amount of cell current, the data state of the cell may be determined. Current sensing carries the advantages of being relatively unsusceptible to variances in the characteristics of individual flash cells and resilience against noise interference.

SUMMARY

However, the use of sensing current to read the data state of a flash data bit may tend to create relatively substantial power consumption during read operations. In order to sense the state of the cell current, a sensamp reference current generally is relatively large, resulting in relatively large power consumption in comparison to a read operation which is not reliant on sensing current in order to determine the nature of the data stored in the flash cell. Consequently, power consumption of the flash memory as a whole may be undesirably large in applications where power is at a premium.

A flash memory has been developed which may reduce the power consumption of the flash memory during read operations relative to flash memory read operations which sense current in the individual cells. In particular, reduction in power consumption may be achieved by using a combination of voltage, resistance and current biasing the individual data bits and detecting a change in bitline voltage owing to the data state of the cell. By relying on detecting voltage rather than measuring current, the amount of current utilized during read operations may be far lower than what may be required by current sensing the cell, consequently lowering power consumption.

The development of voltage sensing, however, has resulted in greater susceptibility to physical variance in individual flash cells and to noise interference. Accordingly, safeguards against cell variation and noise have been developed. In particular, flash cells may be tested to determine a safety margin in their ability to be voltage biased, with cells that fall below the margin standards being found unreliable. Further, electronic discharging schemes may be applied to the inputs/outputs of flash cells to place the inputs/outputs into known states to mitigate the impact of noise on voltage sensing.

In an embodiment, an electrically erasable flash memory comprises a data storage element and a voltage sensing circuit. The data storage element is configured to store a plurality of data bits, each of the plurality of data bits having a data state. The voltage sensing circuit selectively coupled to individual ones of the plurality data bits and configured to bias the individual ones of the plurality of data bits with at least one of a bias current and a bias resistance and to read the data state of the individual ones of the plurality of data bits.

In an embodiment, each of the plurality of data bits has a performance margin. In an embodiment, the voltage sensing circuit is configured to selectively bias the plurality of data bits with the bias being at least one of a read bias and a margin bias and, when the voltage sensing circuit biases the individual one of the plurality of data bits with the margin bias, the individual one of the plurality of data bits induces a response indicative of the performance margin of the individual one of the plurality of data bits.

In an embodiment, the voltage sensing circuit comprises a sensor and a biasing circuit configured to bias the sensor with the bias resistance. Each of the plurality of data bits induces a response in the sensor indicative of the data state of a selected one of the plurality of data bits.

In an embodiment, the voltage sensing circuit comprises a sensor and a biasing circuit configured to bias the sensor with the bias current. Each of the plurality of data bits induces a response in the sensor indicative of the data state of a selected one of the plurality of data bits.

In an embodiment, each of the plurality of data bits has a performance margin, the biasing circuit is configured to selectively bias the sensor with the bias current being at least one of a read bias and a margin bias, and, when the biasing circuit biases the sensor with the margin bias, the individual one of the plurality of data bits induces a response in the sensor indicative of the performance margin of the individual one of the plurality of data bits.

In an embodiment, the plurality of data bits comprise binary data bits having two data states.

In an embodiment, the biasing circuit is configured to selectively bias the sensor with the margin bias being one of a margin high voltage and a margin low voltage. When one of the plurality of data bits is stored in a first of the two data states and the biasing circuit is configured with the margin high voltage, the sensor is indicative of the performance margin of the one of the plurality of data bits for data stored in the first of the two data states. When one of the plurality of data bits is stored in a second of the two data states and the biasing circuit is configured with the margin low voltage, the sensor is indicative of the performance margin of the one of the plurality of data bits for data stored in the second of the two data states.

In an embodiment, the plurality of data bits are organized into a plurality of bitlines and the memory further comprises a pre-discharge circuit operatively coupled to the plurality of bitlines, wherein the pre-discharge circuit is configured to drive at least one of the plurality of bitlines to a predetermined voltage level prior to the individual one of the plurality of data bits inducing the response indicative of the data state in the individual one of the plurality of data bits.

In an embodiment, each of the plurality of bitlines not corresponding to the individual one of the plurality of data bits is driven to the predetermined voltage level.

In an embodiment, the predetermined voltage level is a reference voltage of at least a portion of the memory.

In an embodiment, the biasing circuit is configured to selectively bias the sensor with the margin bias being one of a margin zero bias and a margin one bias. When one of the plurality of data bits is stored in a first of the two data states and the biasing circuit is configured with the margin zero bias, the sensor is indicative of the performance margin of the one of the plurality of data bits for data stored in the first of the two data states. When one of the plurality of data bits is stored in a second of the two data states and the biasing circuit is configured with the margin one bias, the sensor is indicative of the performance margin of the one of the plurality of data bits for data stored in the second of the two data states.

In an embodiment, a memory module comprises a flash memory cell operatively coupled to a voltage reference and configured to sink a relatively high amount of current in a first state and a relatively low amount of current in a second state different from the first state, a bias circuit operatively coupled between a voltage supply and the flash memory cell and configured to form a sensing node between the bias circuit and the flash memory cell and a sensing circuit operatively coupled to the sensing node configured to voltage bias the flash memory cell with a bias and to read the data state of the flash memory cell based, at least in part, on the bias.

In an embodiment, the flash memory cell has a performance margin, the sensing circuit is configured to selectively bias the flash memory cell with the bias being at least one of a read bias and a margin bias, and when the sensing circuit biases the flash memory cell with the margin bias, the flash memory cell induces a response indicative of the performance margin of the flash memory cell.

In an embodiment, the bias circuit induces a bias resistance on the sensing node and wherein the flash memory cell induces a response in the sensor indicative of the data state of the flash memory cell.

In an embodiment, the bias circuit induces a bias current in the flash memory cell and wherein the memory cell induces a response in the sensor indicative of a data state the flash memory cell.

In an embodiment, the flash memory cell has a performance margin, the biasing circuit is configured to selectively bias the sensor with the bias current being at least one of a read bias and a margin bias, and, when the biasing circuit biases the sensor with the margin bias, the flash memory cell induces a response in the sensor indicative of the performance margin of the flash memory cell.

In an embodiment, the flash memory cell comprises binary data bits having two data states.

In an embodiment, the biasing circuit is configured to selectively bias the sensor with the margin bias being one of a margin high voltage and a margin low voltage. When the flash memory cell is stored in a first of the two data states and the biasing circuit is configured with the margin high voltage, the sensor is indicative of the performance margin of the flash memory cell for data stored in the first of the two data states and, when the flash memory cell is stored in a second of the two data states and the biasing circuit is configured with the margin low voltage, the sensor is indicative of the performance margin of the flash memory cell for data stored in the second of the two data states.

In an embodiment, the memory module further comprises a plurality of flash memory cells operatively coupled to the bias circuit and the sensing circuit. The plurality of flash memory cell is organized into a plurality of bitlines. The memory further comprises a pre-discharge circuit operatively coupled to the plurality of bitlines, wherein the pre-discharge circuit is configured to drive at least one of the plurality of bitlines to a predetermined voltage level prior to one of the plurality of flash memory cells inducing the response indicative of the data state in the flash memory cell.

In an embodiment, each of the plurality of bitlines not corresponding to the one of the plurality of flash memory cells is driven to the predetermined voltage level.

In an embodiment, the predetermined voltage level is a reference voltage of at least a portion of the memory.

In an embodiment, the biasing circuit is configured to selectively bias the sensor with the margin bias being one of a margin zero bias and a margin one bias. When the flash memory cell is stored in a first of the two data states and the biasing circuit is configured with the margin zero bias, the sensor is indicative of the performance margin of the flash memory cell for data stored in the first of the two data states and, when the flash memory cell is stored in a second of the two data states and the biasing circuit is configured with the margin one bias, the sensor is indicative of the performance margin of the flash memory cell for data stored in the second of the two data states.

In an embodiment, a method is disclosed of operating an electrically erasable flash memory having a data storage element configured to store a plurality of data bits, each of the plurality of data bits having a data state, and a voltage sensing circuit. The method comprises the steps of selectively coupling individual ones of the plurality data bits to the voltage sensing circuit, biasing the individual ones of the plurality of data bits with a bias, and then reading the data state of the individual ones of the plurality of data bits based, at least in part, on a voltage of the individual ones of the plurality of data bits.

In an embodiment, each individual one of the plurality of data bits has a performance margin, wherein the bias is one of a read bias voltage and a margin bias voltage. The biasing step, for a normal read, selectively biases the plurality of data bits to the read bias to determine the data state of the individual one of the plurality of data bits. The biasing step, for a performance margin test, selectively biases the plurality of data bits to the margin bias to determine the performance margin of the individual one of the plurality of data bits. The method further comprises the step of determining whether or not the data state read from the plurality of data bits for the performance margin test is a correct data state.

In an embodiment, the biasing step comprises coupling a resistance bias to the individual ones of the plurality of data bits to detect a margin high of the individual ones of the plurality of data bits.

In an embodiment, the biasing step comprises coupling a resistance bias and a current bias to the individual ones of the plurality of data bits to detect a margin low of the individual ones of the plurality of data bits.

In an embodiment, the method further comprises the step of selectively biasing the sensor with the margin bias being one of a margin high bias and a margin low bias. When one of the plurality of data bits is stored in a first of the two data states and the biasing circuit is configured with the margin high bias, the sensor is indicative of the performance margin of the one of the plurality of data bits for data stored in the first of the two data states. When one of the plurality of data bits is stored in a second of the two data states and the biasing circuit is configured with the margin low voltage, the sensor is indicative of the performance margin of the one of the plurality of data bits for data stored in the second of the two data states.

In an embodiment, the plurality of data bits are organized into a plurality of bitlines and the memory further comprises a pre-discharge circuit operatively coupled to the plurality of bitlines. The method further comprises the step of driving, with the pre-discharge circuit, at least one of the plurality of bitlines to a predetermined voltage level prior to the individual one of the plurality of data bits inducing the response indicative of the data state in the individual one of the plurality of data bits.

In an embodiment, the method further comprises the step of driving each of the plurality of bitlines not corresponding to the individual one of the plurality of data bits to the predetermined voltage level.

FIGURES

FIGS. 8a, 8b and 8c are illustrations of margin testing and read operations;

DESCRIPTION

Figure 1A:
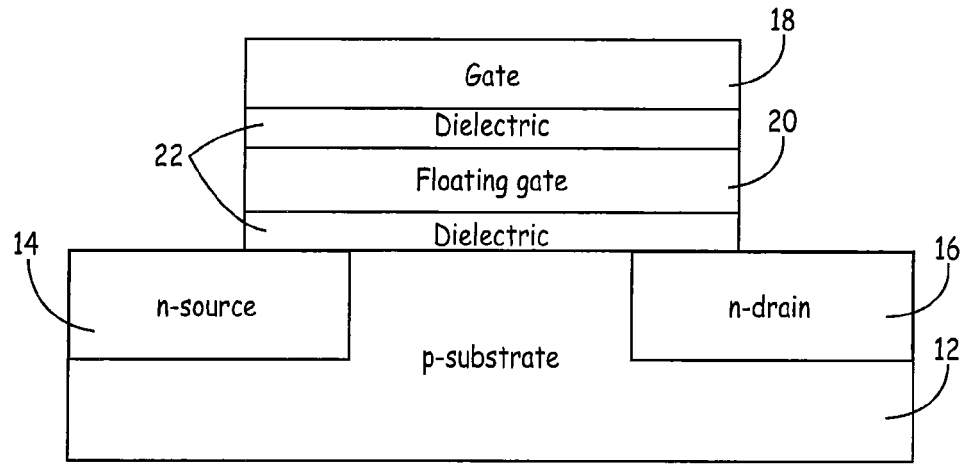
FIGS. 1a and 1b are a simplified depictions of a typical flash memory cell.

FIG. 1a is a simplified depiction of a typical flash data bit or flash memory cell 10 known in the art. Throughout this description, flash data bit and flash memory cell are used interchangeably. An adaptation of a conventional metal-oxide substrate field effect transistor (MOSFET), a channel may be created in p-substrate 12 between n-source 14 and n-drain 16 by inducing a charge on gate 18. Unlike in a conventional MOSFET transistor, however, floating gate 20 is incorporated between dielectric layers 22 between gate 18 and p-substrate 12. The creation of a voltage on gate 18 causes floating gate 20 to store electrons which, owing to the presence of dielectric layers 22, do not readily escape floating gate 20. The presence of the charge in floating gate 20 causes a predictable variance in the voltage threshold of flash memory cell 10 which may be conventionally detected as part of a read operation. The ability of flash memory cell 10 to store digital information long term may, by consequence, be dependent on the ability of floating gate 20 to maintain an applied charge without substantial degradation over time.

The various components of flash memory cell 10 may be sized according to contemporary processes. In an embodiment, flash memory cell 10 is formed according to the 0.25 micrometer process. In such an embodiment, flash memory cell 10 has 0.9 micrometer by 1.20 micrometer dimensions.

Figure 1B:
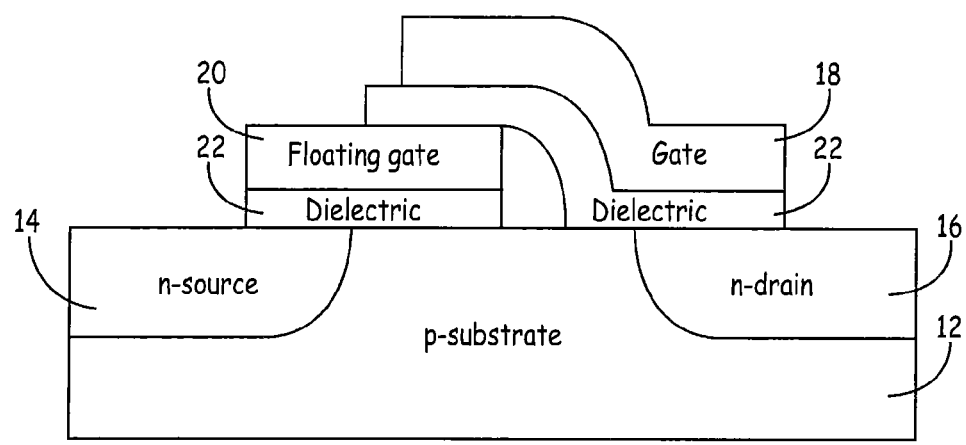

FIG. 1b is a depiction of an exemplary physical embodiment of flash memory cell 10. In an exemplary embodiment, flash memory cell 10 is read by placing gate 18 at two (2) Volts, drain 16 at 1.4 Volts and n-source 14 at zero (0) Volts, and the resultant current from drain 16 to source measured; if the drain-to-source current is less than approximately one (1) microampere then a logical "0" is stored in cell 10, while if the drain-to-source current is greater than approximately ten (10) microamperes then a logical "1" is stored in cell 10. In an embodiment, flash memory cell 10 may be programmed by placing gate 18 at 1.7 Volts, n-drain 16 at 0.6 Volts and n-source 14 at 9.5 Volts. In an embodiment, flash memory cell 10 may be erased by placing gate 18 at thirteen (13) Volts, n-drain 16 at zero (0) Volts and n-source 14 at zero (0) Volts.

Figure 2:
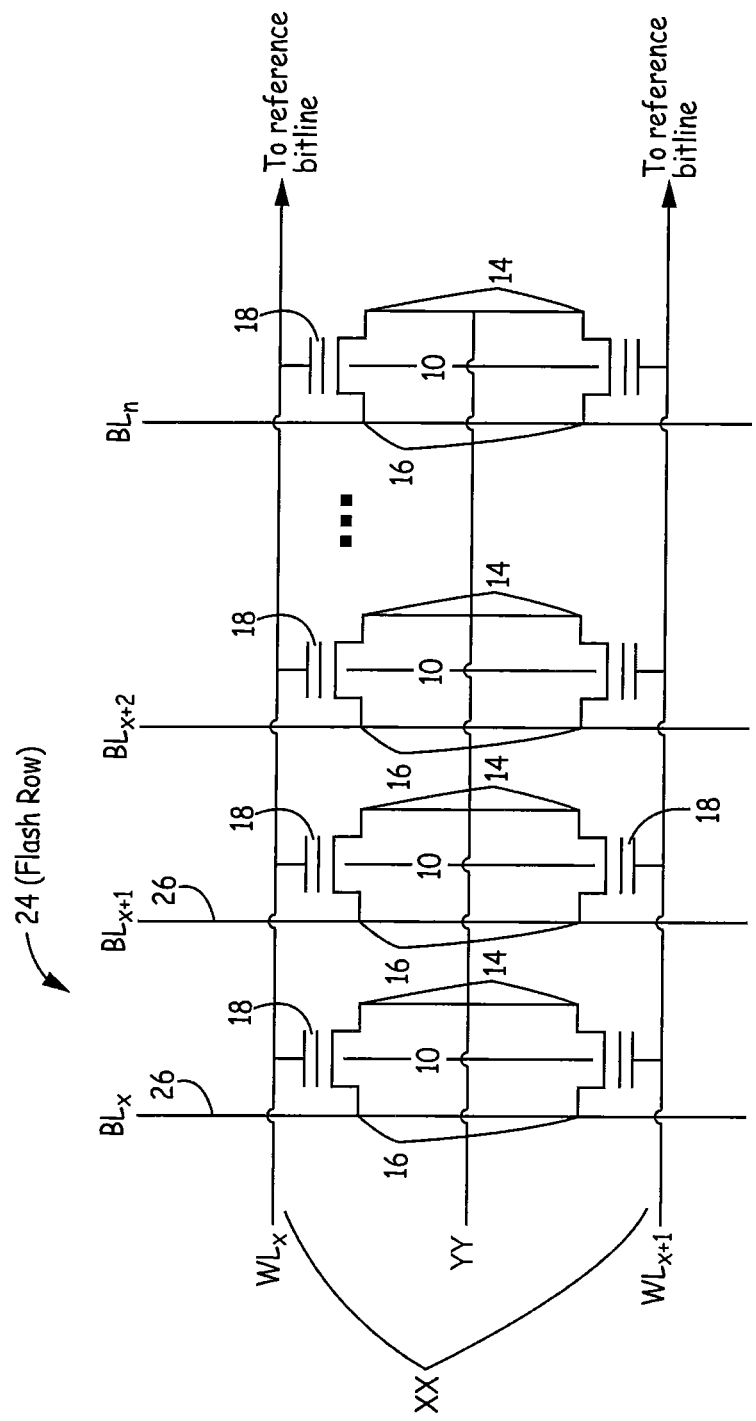
FIG. 2 is a line of flash memory cells.

FIG. 2 is an exemplary application of multiple flash memory cells 10 being incorporated within line 24 to provide multi-bit data storage. N-sources 14 are shorted to a source line (YY) and N-drains 16 are coupled to bitlines 26. Gates 18 are coupled to wordlines (XX). In so doing, a particular bit of each of multiple data words (for instance, bit 0 of each of words 0 and 1) may be accessed on bitline 26 and the wordline through a read operation. By repeating this structure on multiple additional lines 24, additional bits of the words of illustrated line 24 (for instance, bit 0 of words 2 and 3) may be accessed for reading and writing. In an embodiment, each line 24 has two thousand ninety six (2,096) cells 10, providing a flash bitline address spacing of two thousand ninety six (2,096) per line 24. In an embodiment, each bitline 26 connects to two hundred fifty-six (256) flash data bits 10.

Figure 3A:
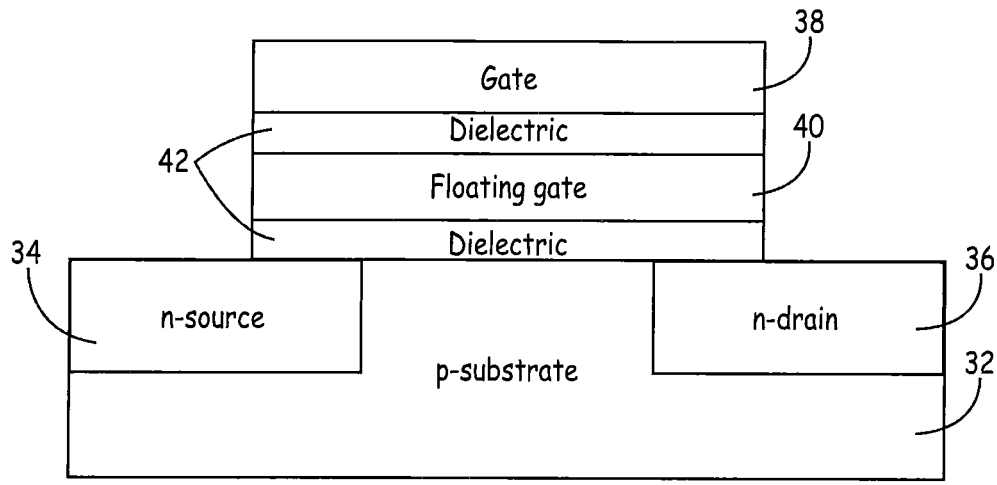
FIGS. 3a and 3b are simplified depictions of a typical ROM memory cell.
Figure 3B:
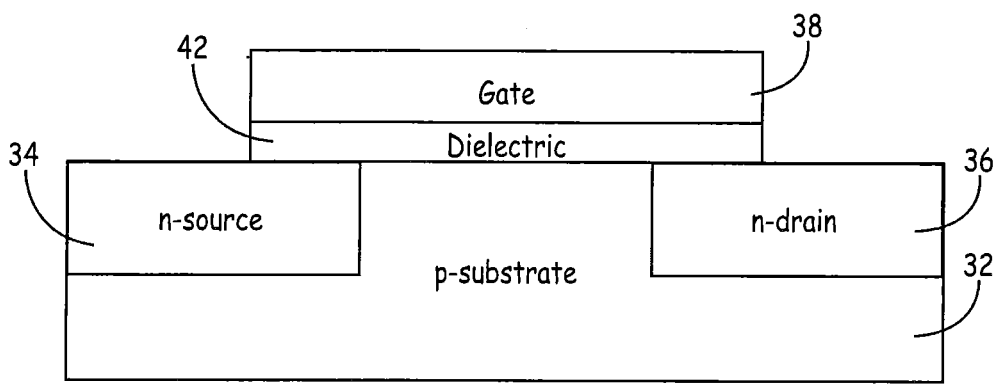

FIG. 3a is a simplified depiction of a typical electrically programmable read-only memory (EPROM) data bit or memory cell 30 known in the art. Throughout this document, the terms read-only memory cell, read-only data bit, ROM or EPROM data bit, ROM or EPROM memory cell are used interchangeably. While the electrically programmable read-only memory cell 30 is shown for illustrative purposes, read-only memory cells which are not electrically programmable may also be utilized, as illustrated in FIG. 3b. In various embodiments, ROM data bit 30 is not electrically programmable. Like flash memory cell 10, ROM data bit 30 is also an adaptation of a conventional MOSFET, with a channel being created in p-substrate 32 between n-source 34 and n-drain 36 by inducing a charge on gate 38.

In contrast with floating gate 20 of flash memory cell 10, which is commonly comprised of conventional polycrystalline silicon as used in MOSFET, floating gate 40 of EPROM data bit 30 is doped so as to resist changes in floating gate's 40 electric potential after placing floating gate 40 in a particular logical state. For instance, while floating gate 40 may be switched so that ROM data bit 30 stores a logical "1" to a logical "0", the doping of floating gate 40 may prevent switching from a logical "0" to a logical "1". In various embodiments, floating gate 40 is doped with phosphorous. While dielectric layers 42 may be incorporated as in flash memory cell 10, dielectric layers 42 may not be required to maintain the electric potential of floating gate 40. In embodiments which are not electrically programmable, and thus do not incorporate floating gate 40, a contact or lack of contact may set the state of ROM memory cell 30 as known in the art.

The various components of ROM data bit 30 may be sized according to contemporary processes known in the art. In an embodiment, cell 30 is formed according to the 0.25 micrometer process. In such an embodiment, cell 30 has 1.375 micrometer by 0.9 micrometer dimensions.

Figure 4A:
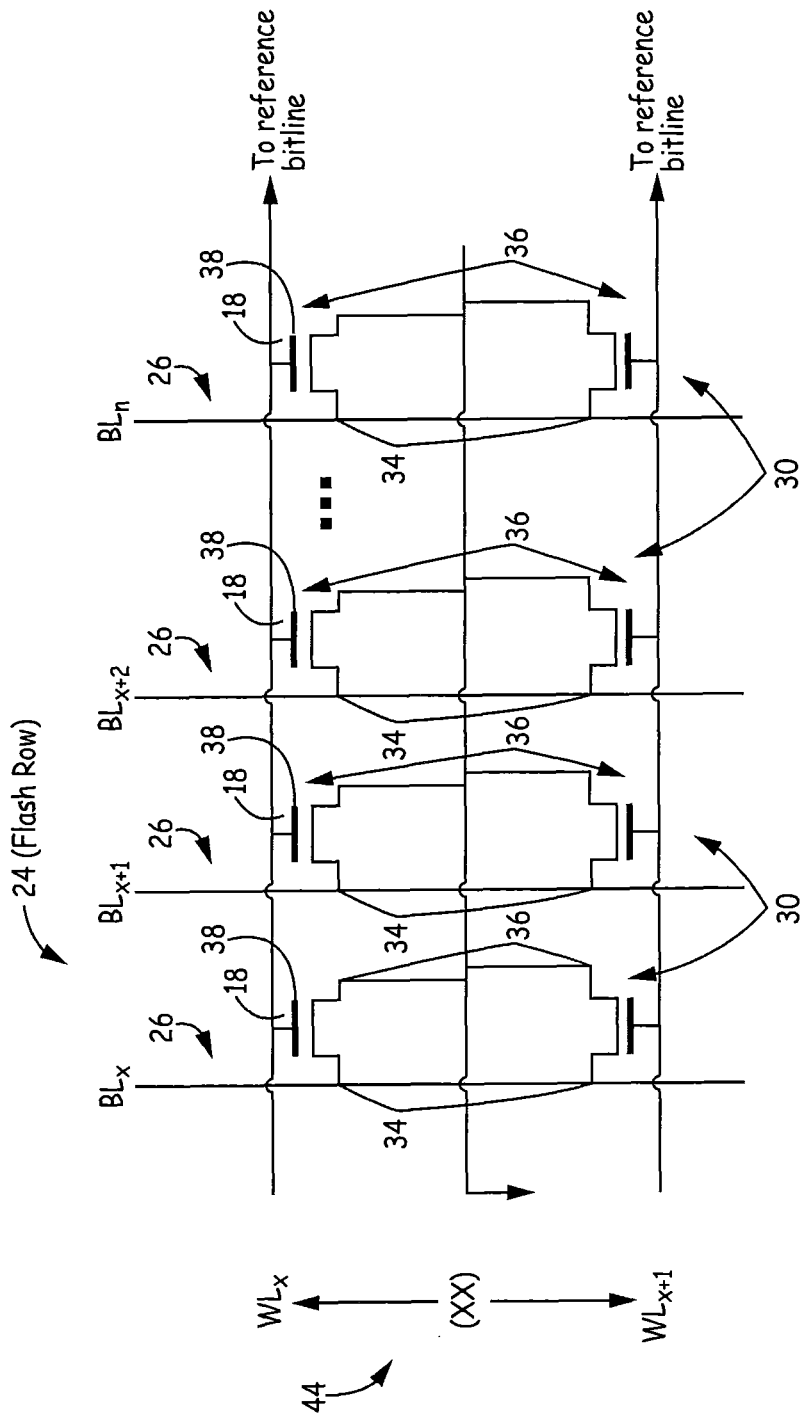
FIGS. 4a and 4b are lines of ROM memory cells.
Figure 4B:
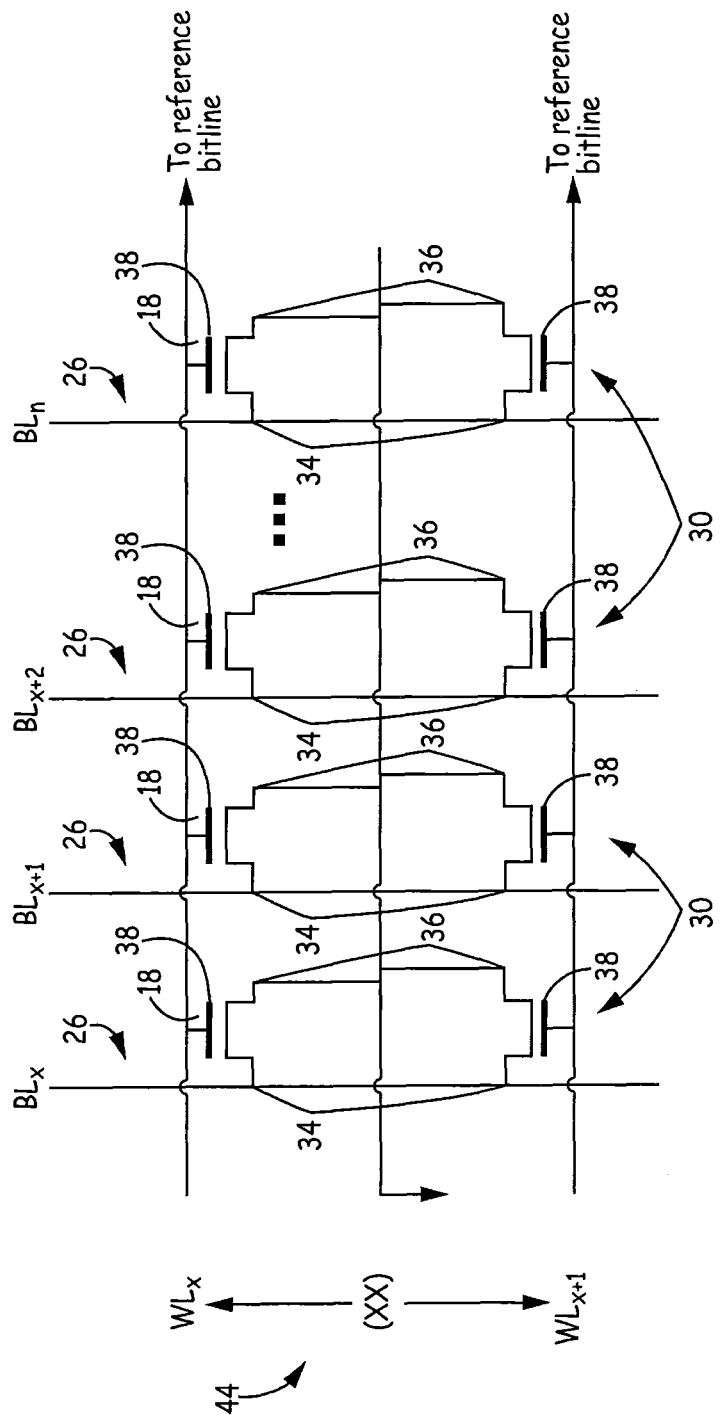

FIGS. 4a and 4b are exemplary applications of multiple ROM data bits 30 being incorporated within line 44 to provide multi-word data storage. In FIG. 4a, N-drain 34 and n-source 36 of adjacent ROM data bits 30 are coupled to bitlines 26 and ground respectively while gates 38 are coupled to wordlines XX). In so doing, a particular bit of each of multiple data words (for instance, bit 0 of each of words 0-1) may be accessed on bitline 26 through a read operation on a word selected by the wordline. By repeating this structure on multiple additional lines 44, additional bits of the words of illustrated line 44 (for instance, bit 0 of words 2-3) may be accessed for reading and writing. In an embodiment, each line 44 includes two thousand ninety six (2,096) cells 30, providing a ROM bitline address spacing of two thousand ninety six (2,096) per line 44. In an embodiment, each bitline 26 corresponds to two hundred fifty-six (256) ROM data bits 30.

The various embodiments described above are merely exemplary, as various additional types of flash data bits 10 are known in the art and myriad ROM data bits 30 are also known in the art. Similarly, flash data bits 10 and ROM data bits 30 are commonly organized into lines and columns according to various techniques dependent on the circumstances of the data bits themselves and the circumstances of their use. However, incorporating flash data bits 10 according to a common addressing scheme, i.e., common schemes by which bitlines 26 and wordlines 48 are assigned between and among flash data bits 10 and ROM data bits 30, due to the differing characteristics of flash data bits 10 and ROM data bits 30, may make the resultant memory relatively inefficient. In particular, because flash data bits 10 and ROM data bits 30 have differing dimensions, common addressing schemes may tend to create wasted space on a chip. Similarly, because flash data bits 10 and ROM data bits 30 have different performance characteristics, such as the amount of time needed to read data from one or the other, utilizing non-alike data bits within a common addressing scheme may, unless particularly addressed, create unreliabilities.

As illustrated, line 44 has shared N-sources 36 coupled to ground In various embodiments, ROM memory cells 30 are programmed by either including or not including a drain connection for each ROM memory cell 30. If there is a drain connection, the ROM memory cell may conduct current when selected. If there is no drain connection, the ROM memory cell may conduct no current when selected. The drain connection can be made with many semiconductor materials. In one embodiment, the connection is a contact. In other embodiments, for example, the connection is a via, metal or diffusion layer.

Figure 5:
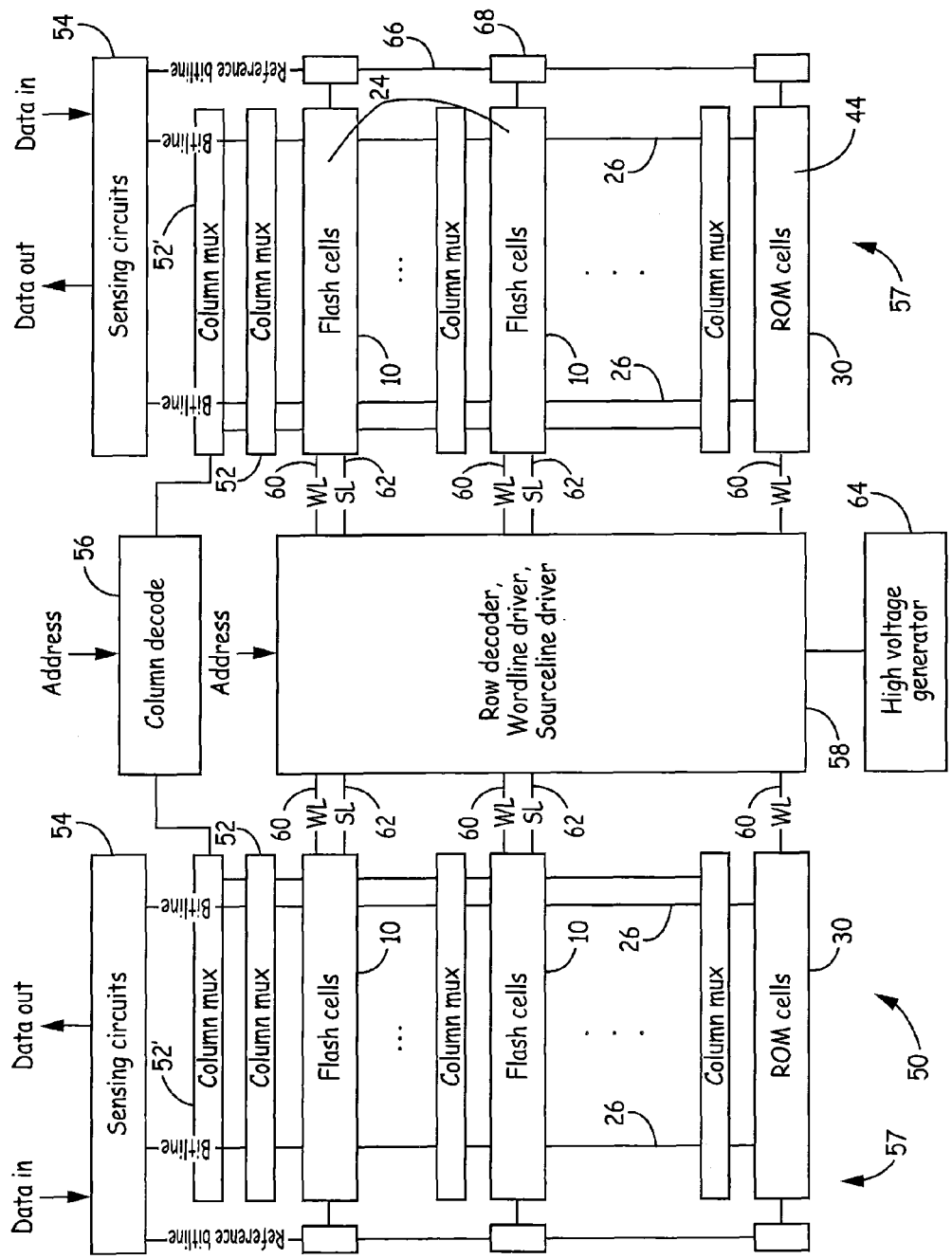
FIG. 5 is a memory array or module having both flash memory cells and ROM memory cells.

FIG. 5 is a block diagram of memory array or module 50 which is a single memory array incorporating both flash data bits 10 (not shown with particularity) and ROM data bits 30 (not shown with particularity) according to a common addressing scheme. Flash data bits 10 are organized into lines 24 and ROM data bits are organized into lines 44, as discussed above. Multiple bitlines 26 extend from rows 24, 44 to column multiplexor 52 as known in the art. Sensing circuits 54 are read circuitry utilized to detect information placed on bitlines 26 and thus determine what the contents of a particular data bit are, irrespective of whether the data bit is a flash data bit 10 or a ROM data bit 30.

Column decode block 56, similar to that of column decoders known in the art, is overhead circuitry that controls a particular column multiplexor 52' to select each bitline 26 based on the column address as input into column decode block 56. It is noted that in the illustrated embodiment, memory module 50 is divided into halves 57, each with its own addressing circuitry such as multiplexors 52, 52' and read circuitry such as sensing circuits 54, to promote simplicity in such circuitry. In various alternative embodiments, memory module 50 may not be divided at all and thereby not multiple blocks of, for instance, multiplexors 52, 52' and sensing circuitry 54, or may be divided into more than two blocks with an accompanying multiplexors 52, 52' and sensing circuitry 54 for each block.

Line electronics 58 is overhead circuitry which includes a row decoder, wordline driver and sourceline driver. The row decoder, as is familiar in the art, is configured to select a particular row or line 24, 44 based on the input address. The wordline driver and the sourceline driver combine to create a voltage differential between wordline 60 and sourceline 62, respectively. Wordline 60 and sourceline 62 provide a voltage differential over flash memory cells 10 in order to read or write the flash memory cell, as known in the art. As ROM memory cells 30 cannot be written to, only the wordline driver is coupled to a wordline 60 ROM memory cells 30. The presence of a high voltage, such as a reference voltage, or a low voltage, such as a ground voltage, selects each row 24, 44 for the purposes of reading the data from the cells 10, 30 of the particular row 24, 44. In combination with the applied voltage on bitlines 26 from sensing circuitry or sensing circuit 54, individual cells 10, 30 may be selectively activated for reading and, in the case of flash memory cells 10, writing.

High voltage generator 64 is overhead circuitry configured to supply voltages for programming and erasing flash memory cells 10. In an embodiment, nine and one half (9.5) Volts is used for programming flash memory cells 10 and thirteen (13) Volts is used for erasing flash memory cells 10. In an embodiment, high voltage generator 64 comprises at least one 2.0 Volt supply coupled to a Dickson charge pump to provide the programming and erasing voltages as appropriate.

Reference bitline 66 is structurally similar to bitlines 26. However, reference bitline 66 is physically positioned at the far end of each row 24, 44 relative to line electronics 58. As will be discussed further below, the positional distance of reference bitline 66 may provide a deliberate delay in the operation of sensing circuit 54 in reading data following a selection of a particular memory cell 10, 30 for reading by column decode block 56 and the wordline driver. Because of the physical differences between flash memory cells 10 and ROM memory cells 30, the timing of activation of such cells 10, 30 may vary with respect to one another.

In certain circumstances, because ROM memory cells 30 are physically larger than flash memory cells 10, it may take longer for signals to propagate down wordlines 60 on ROM rows 44 than on flash rows 24. Alternatively, ROM memory cells 30 may access faster than flash memory cells 10 owing to a shorter effective channel length on ROM memory cells 30 compared with flash memory cells 10. This causes the read current to be higher and the sense amp triggers faster as does the circuit that times the read. As a result, the timing by which a selected flash memory cell 10 may place data on its bitline 26 during a read operation may occur later in time than the same read operation on a corresponding ROM memory cell 30. Thus, the twelfth flash memory cell 10 in row 24 may place its data on its corresponding bitline 26 slower than the twelfth ROM memory cell 30 in row 44. Because the twelfth flash memory cell 10 and the twelfth ROM memory cell 30 of each row 24, 44 utilize the same bitline 26, sensing circuits 54 may not, without an additional indication, be able to predict when the signal on the twelfth bitline 26 will be accurate.

When a signal propagates from the wordline driver, because the memory cell 10, 30 is located physically closer to the wordline driver than reference bitline 66, it may inherently be the case that the particular memory cell 10, 30 is activated before reference bitline cell 68, a reference memory cell 10 or 30, as appropriate to the row 24, 44 in which it is located. In certain embodiments, reference bitline cell 68 may be physically sized differently than flash memory cells 10 and ROM memory cells 30 so as to trigger more slowly than flash memory cells 10 and ROM memory cells 30. In an embodiment, reference bitline cell 68 is a dummy memory cell not configured to store data.

It is known that once reference bitline 66 is activated, whatever the selected memory cell 10, 30 may be, the selected memory cell 10, 30 should have been activated, allowing sensing circuits 54 to read the data on the bitline 26 corresponding to the selected memory cell 10, 30. Consequently, activation of reference bitline 66 provides an indication to sensing circuit 54 that the data on the selected bitline 26 may be accurately read. As a result, reference bitline 66 provides the same sensing circuit 54 to read both flash memory cells 10 and ROM memory cells 30.

Figure 6:
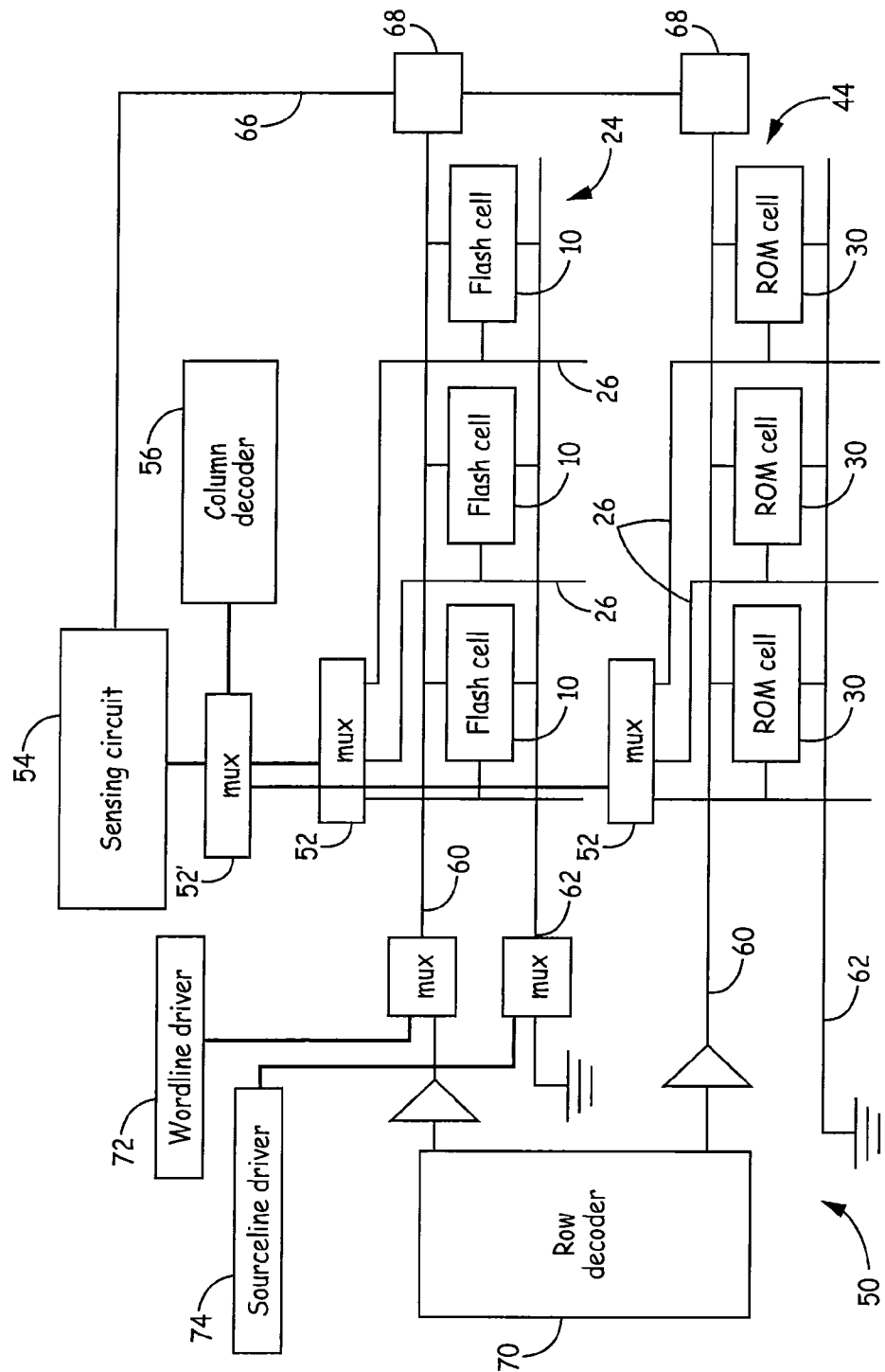
FIG. 6 is a block diagram of the memory array or module of FIG. 5.

FIG. 6 is a block diagram illustrating detail of memory module 50, illustrating individual flash memory cells 10 and ROM memory cells 30. Row decoder 70 includes selection circuitry to select lines 24, 44 for wordline driver 72 and sourceline driver 74. Bitlines 26 are selected by way of column decode block 56 and column multiplexors 52, 52'. Individual cells 10, 30 are positioned physically closer to row decoder 70 than is reference bitline cell 68. As a result, flash memory cells 10 and ROM memory cells 30 may utilize a common addressing and sensing scheme, while flash memory cells 10 may utilize a common writing scheme.

Figure 7A:
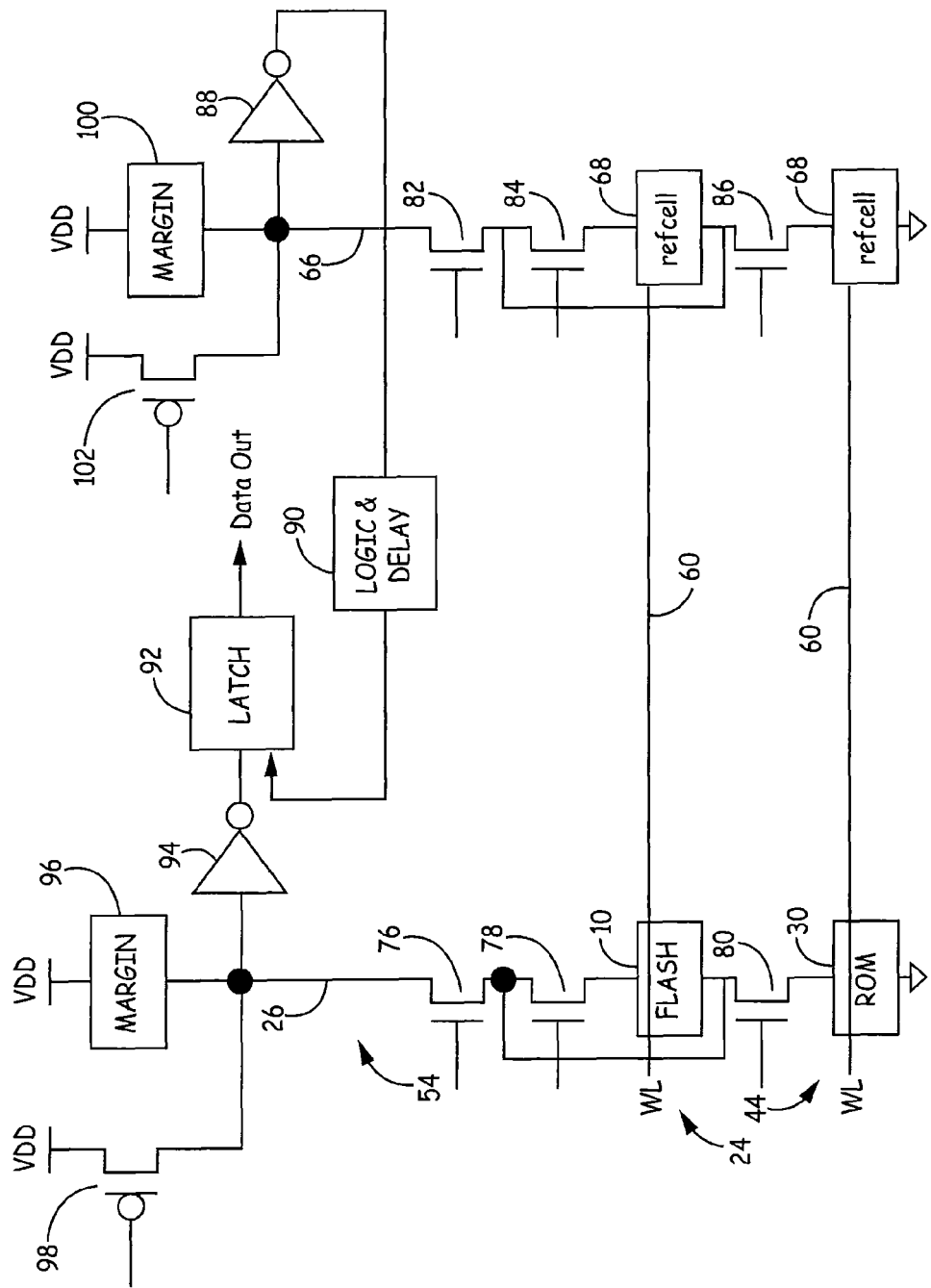
FIGS. 7a and 7b are block diagrams of a sensing circuit.

FIG. 7a is a simplified block diagram of an embodiment of sensing circuit 54 and illustrative memory cells 10, 30 coupled to sensing circuit 54 by way of bitline 26. It is noted that for simplicity only a single bitline 26 is illustrated, though in the actual implementation there would be as many rows 24, 44 as are present in memory module 50 (FIG. 5) and as many bitlines 26 as there are columns in rows 24, 44. Switch 76 may be utilized to select a particular bitline 26 for reading while switches 78, 80 may be utilized to select a particular cell 10, 30 on the particular bitline 26 for reading. Switches 76, 78 and 80 are detail of column multiplexors 52 and 52'.

Reference bitline cells 68 are coupled to reference bitline 66 and are selectable via switches 82, 84, 86 in a manner similar to that of bitline 26. Reference bitline 66 is coupled to inverter 88 and from there to logic and delay block 90 and latch 92. Latch 92 is configured to store the result of sensing the voltage on bitline 26 by way of inverter 94. Logic and delay block 90 operates latch 92 based on the change in reference bitline 66.

As is known in the art, in order to read cells 10, 30, an electronic stimulus is applied to cells 10, 30 and the effect of cells 10, 30 on the input electronic stimulus is measured. In an embodiment, cells 10 and 30 are variably biased with current, resistance or both and when wordline 24 or 44 is selected the voltage on bitline 26 is measured by way of inverter 94 and stored in latch 92. If the charge stored in cell 10, 30 is such that cell 10, 30 conducts current and functions as a closed circuit, the voltage on bitline 26 may be low, that is reflected digitally by inverter 94. Likewise, if the charge stored in cell 10, 30 is such that cell 10, 30 conducts little current, the voltage on bitline 26 may be high, which may be reflected digitally by inverter 94. In an embodiment, the voltage on bitline 26 has a maximum of approximately two (2) Volts and a minimum of approximately zero (0) Volts, while inverter 94 has a threshold of between approximately 0.7 Volts to one (1) Volt.

Consequently, if the voltage on bitline 26 is less than approximately one (1) Volt inverter 94 may register that a logical "1" is in the cell 10, 30 influencing bitline 26 by outputting a high voltage to latch 92. If the voltage on bitline 26 is greater than approximately one (1) Volt inverter may register that a logical "0" is in the cell 10, 30 influencing bitline 26 by outputting a low voltage to latch 92.

Particularly regarding flash memory cells 10, though also in certain instances with respect to ROM memory cells 30, certain cells 10 may lose their ability to store charge on floating gate 20, effectively rendering cell 10 inoperative and losing the data stored in cell 10. To manage the reliability of cells 10, margin bias circuit 96 provides variable bias current to test a reliability of cells 10, 30.

Margin bias circuit 96, in the illustrated embodiment a hold circuit based on P-channel transistors (below) is configurable to provide testing to assess not merely the ability of cell 10 to store a logical "0" and a logical "1", but rather whether cell 10 only barely has the ability to store a logical "0" or logical "1", or if cell 10 has some margin in its ability to store a logical "0" or a logical "1". In particular, if cell 10 can store a logical "0" or logical "1", but cannot demonstrate margin in the ability to store logical "0" or logical "1", data stored in cell 10 may be preserved by being transferred to another cell 10 while the cell 10 which failed the margin test may be deemed unreliable and, in an embodiment, not utilized for further data storage.

Pull-up circuit 98 forces bitline 26 in a known, charged state, in an embodiment two (2) Volts. Consequently, a read operation on cell 10 may be conducted such that the state on bitline 26 changes when floating gate 20 is charged. Thus, the charge on floating gate 20 must be strong enough to permit the flow of current over cell 10 to change the state of bitline 26 in order to store a logical "1".

Margin bias circuit 96 is configurable to provide current to keep bitline 26 high after pull-up circuit 98 is switched off. In a conventional read operation to determine what is stored in cell 10, in an embodiment, margin circuit 96 contains two P transistors YY and XX. P transistor YY and P transistor XX provide a base amount of current to keep bitline 96 high. In an embodiment, P transistor YY provides approximately four (4) microamperes of current to bias bitline 26. In an embodiment, P transistor XX provides approximately five (5) microamperes of current to bias bitline 26. Consequently, in such an embodiment, to store a logical "1", cell 10 must be able to pass or "sink" at least nine (9) microamperes of current to change the voltage state of bitline 26 sufficient to be recorded by inverter 94. If cell 10 passes or sinks less than nine (9) microamperes of current, a logical "0" will be stored.

In an embodiment, margin bias circuit 96 is configured to conduct a test on cell 10 to determine if cell 10 has margin in its ability to store a logical "0". In an embodiment, margin bias circuit 96 is configured to provide four (4) microamperes of current to conduct a test of cell's 10 ability to store a logical "0". If the charge stored in floating gate 20 is not strong enough to permit cell 10 to sink four (4) microamperes in total four (4) microamperes from P transistor YY and zero (0) microamperes from P transistor XX, then cell 10 may be deemed to have sufficient margin to reliably continue to store a logical "0".

In various alternative embodiments, margin bias circuit 96 is configured to provide different amounts of current dependent on the characteristics of cell 10 and the degree of margin that is desired for a cell 10 to qualify as reliable. In the above embodiment, margin bias circuit 96 is configured to provide four (4) microamperes to test cell's 10 ability to store a logical "0"; as cell 10 would need to sink less than four (4) microamperes to qualify as being reliable. The above principles apply to demonstrate greater or lesser amounts of margin.

The ability of cell 10 to store a logical "1" operates on a related principle. To store a logical "1", floating gate 20 must store enough charge that cell 10 can sink more current than the amount being forced onto bitline 26 and thereby allow the voltage on bitline 26 to drop beyond that which registers as a low voltage for inverter 94.

In a conventional read mode, then, when margin bias circuit 96 provides, in the above embodiment, four (4) microamperes on P transistor YY and five (5) microamperes on P transistor XX, cell 10 must sink more current than the combined nine (9) microamperes and therefore force bitline 26 low. In order to test for the reliability of cell 10 to store a logical "1", margin bias circuit 96 provides an additional five (5) microamperes of current into bitline 26. Therefore, cell 10 must now pass or sink a combined fourteen (14) microamperes. The additional five (5) microamperes is forced into bitline 26 by P transistor ZZ. If cell 10 can sink the original nine (9) microamperes plus the additional current provided by P transistor ZZ, the cell is tested as having sufficient margin to be considered reliable.

In various alternative embodiments, margin bias circuit 96 provides different amounts of current, resulting in different amounts of margin for logical "0" and logical "1".

In further alternative embodiments, the amount of current margin bias circuit 96 provides is selectable in percentage terms. For instance, a margin "0" test may be conducted to provide a selectable percentage margin over a normal read operation. In the above embodiment, a margin "0" test of) four (4) microamperes provides an indication of approximately fifty (50) percent of margin over the nine (9) microamperes of a normal read operation. Similarly, a margin "1" test may be conducted to provide a selectable percentage. In an embodiment, margin bias circuit 96 may be configurable to provide current in order to indicate variable percentage of margin.

In various embodiments, pull-up circuit 98 is not provided, and margin bias circuit 96 provides all intended current biasing on bitline 26. In such embodiments, margin bias circuit 96 simply provides a variable amount of bias current on bitline 26, in the above embodiment four (4) microamperes, nine (9) microamperes and fourteen (14) microamperes for margin "0" testing, normal read operations and margin "1" testing, respectively.

In certain embodiments, a current which induces a voltage may also be referenced in terms of the resistance which is utilized to induce the current. Thus, margin bias circuit 96 and pull-up circuit 98 may be understood to impart a bias resistance rather than, or in addition to the bias current described herein. The resistance would be determined by the size of the transistors in each circuit.

Reference hold circuit 100 and reference pull-up circuit 102 provide related testing of reference bitline cells 68 as margin bias circuit 96 and pull-up circuit 98 provide for cells 10. In an alternative embodiment illustrated in FIG. 7b, reference hold circuit 100 is not included and pull-up circuit 102 provides pro-charging of reference bitline 66. As, in various embodiments, reference bitline cells 68 are electrically similar or identical to those of cells 10, pull-up circuit 102 is configured to force reference bitline high and reference hold circuit 100 may variably provide five (5) eighth (8) and thirteen (13) microamperes for margin "0" testing, normal reading and margin "1" testing, respectively. Margin bias circuit 96 and reference hold circuit 100 may be selectable from any electronic circuitry known in the art which can reliably be configured to provide a predetermined and selectable amount of current.

Figure 7B:
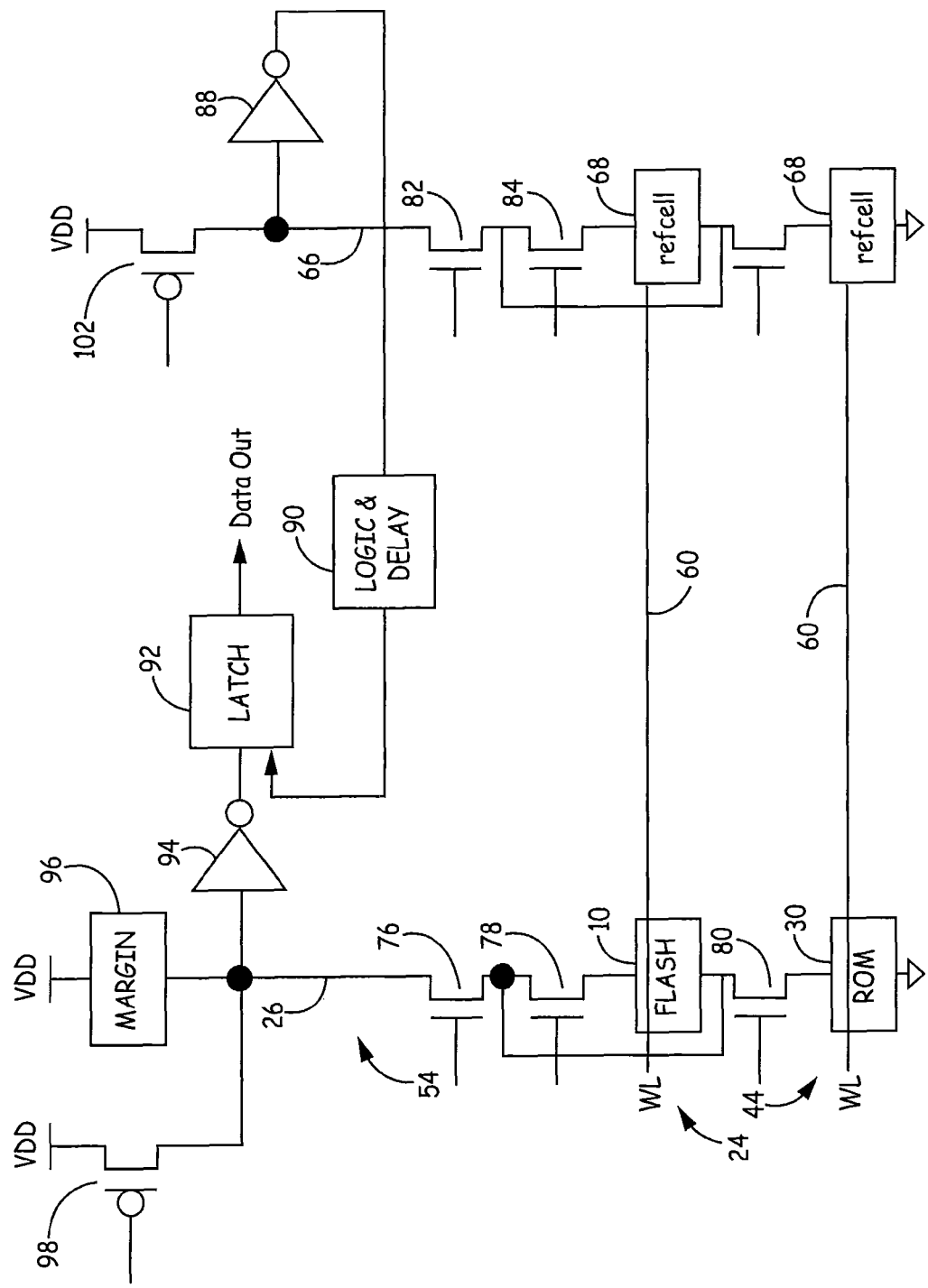
Figure 8A:
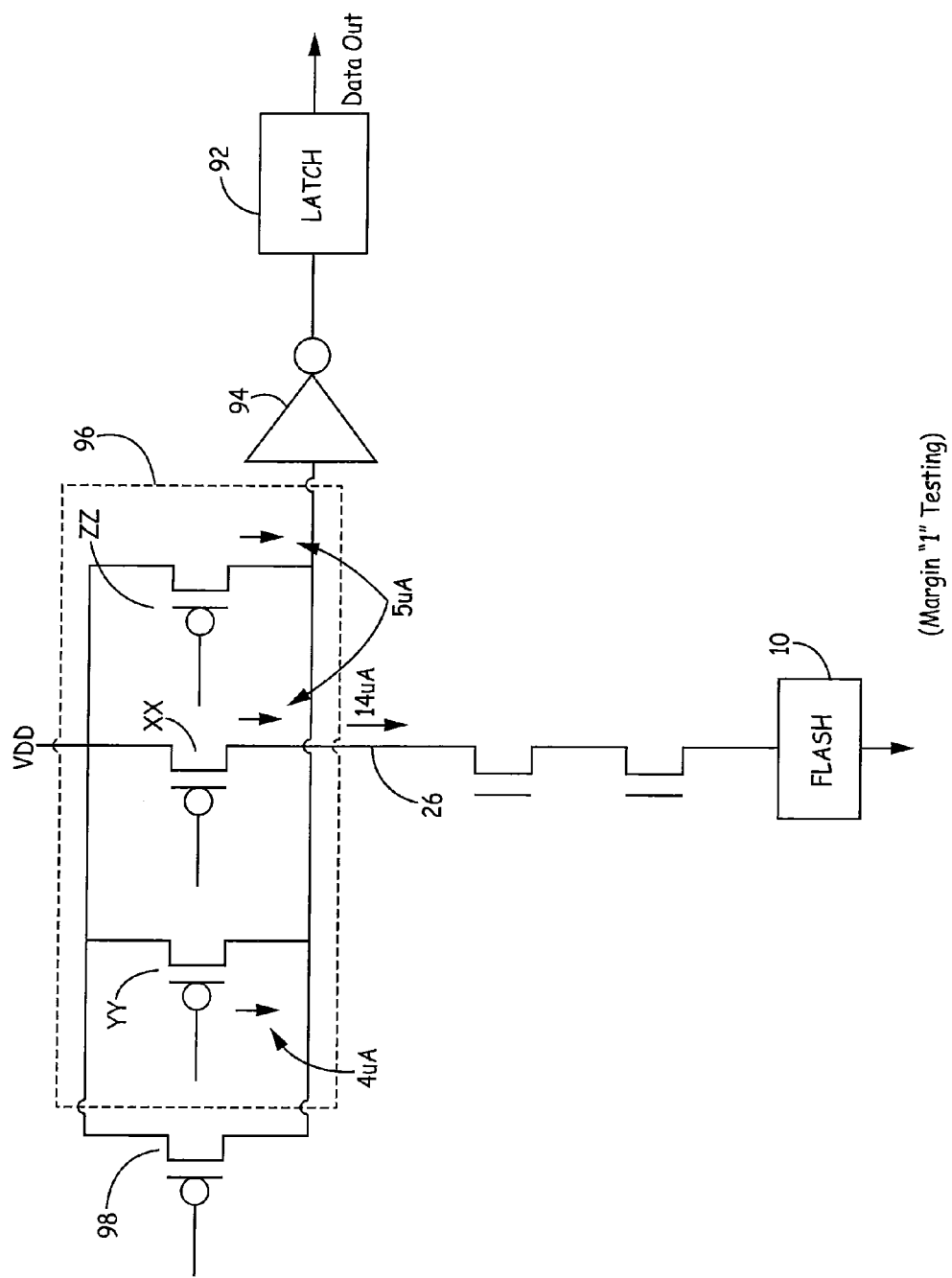
Figure 8B:
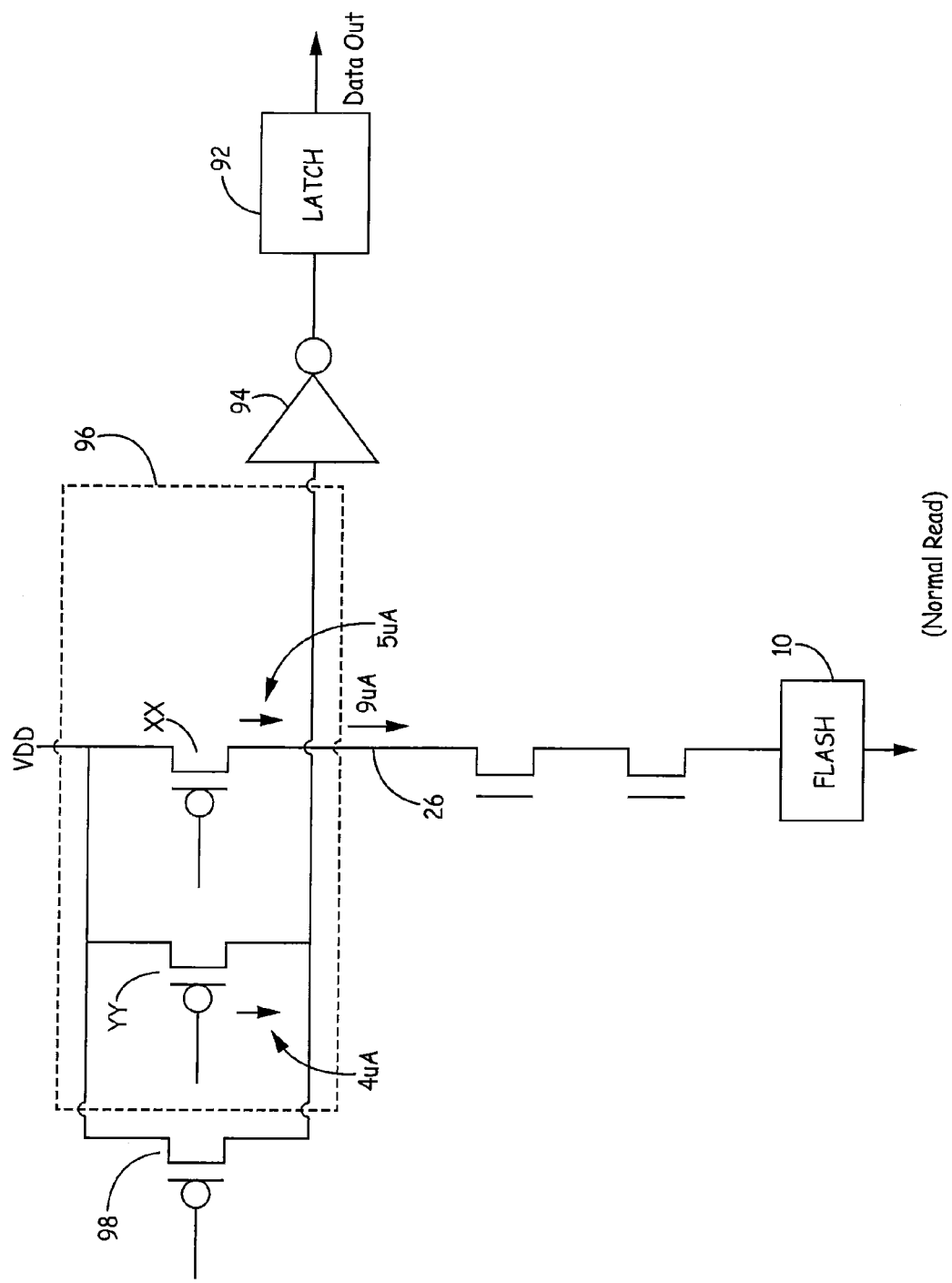

FIGS. 8a, 8b and 8c are exemplary block diagrams of a portion of FIGS. 7a and 7b illustrating margin "1" testing, a normal read operation and margin "0" testing, respectively. In all of FIGS. 8a, 8b and 8c, pull-up circuit 98 precharges bitline 26 to VDD. In FIG. 8a, margin bias circuit 96 is configured for a margin "1" test of cell 10 and produces fourteen (14) microamperes of current. Cell 10 may be determined to have adequate margin for reading a logical "1" if the voltage input to inverter 94 remains below the transition threshold of inverter 94.

In FIG. 8b, margin bias circuit 96 is configured for a normal read operation and produces nine (9) microamperes of current. Cell 10 may be expected to have accurately displayed the digital bit stored therein and the inverter may be deemed to have accurately reported the nature of the digital bit stored therein based on the voltage on bitline 26 being above or below the transition threshold of inverter 94, as the case may be.

In FIG. 8c, margin bias circuit 96 is configured for a margin "0" test of cell 10 and produces four (4) microampere of current. Cell 10 may be determined to have adequate margin for reading a logical "0" if the voltage input to inverter 94 remains above the transition threshold of inverter 94.

Figure 9:
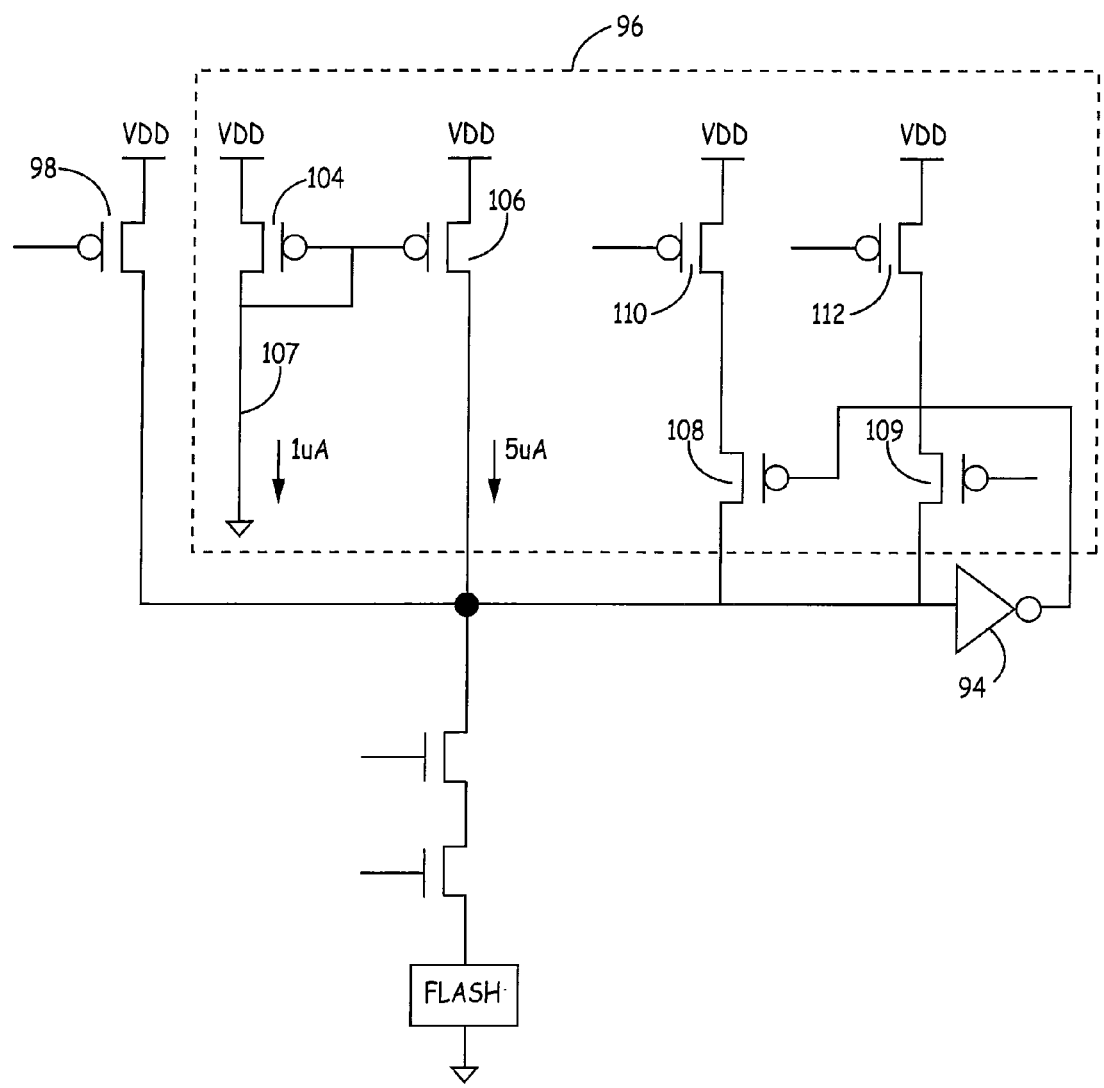
FIG. 9 is a schematic diagram of a margin bias circuit and a pull-up circuit.

FIG. 9 is a schematic diagram of margin bias circuit 96 and pull-up circuit 98. Margin bias circuit 96 includes P-channel metal oxide semiconductor transistors 104, 106 (or "PMOS" transistors, as known in the art) sized to mirror five (5) microamperes of current from current source 107. In an embodiment, transistors 104 and 106 are approximately one (1) micrometers by two hundred eighty (280) nanometers and approximately five (5) micrometer by two hundred eighty (280) nanometers, respectively. In an embodiment, when performing margin "0" testing, a 2.0 Volt supply is increased to approximately 2.1 Volts to increase potential leakage current into sensing circuit 54 (FIG. 5). In an embodiment, current source 107 is provided for margin "1" testing.

Margin bias circuit 96 further includes PMOS transistors 110 and 112 sized to provide four (4) microamperes and five (5) microamperes of current, respectively. In an embodiment, transistors 108 and 109 are provided to turn off currents in transistors 110 and 112 after the data is latched in latch 92 to save power. In the illustrated embodiment, transistors 110 and 112 control the delivery of current via transistors 108 and 109, respectively. In an embodiment, transistors 110, 112, 108 and 109 provide current for normal read, transistor 110 and 108 provide current for margin "0" read, and transistors 110, 108, 112, 109, 104, 106 and current source 107 provide current for margin "1" read. It is emphasized that transistors 104, 106, 108, 109, 110, 112 merely provide an illustrative embodiment of one way to provide a bias current on bitline 26, and that the sizes of transistors 104, 106, 108, 109, 110, 112 are selectable based on the circumstances in which they are applied.

Figure 10:
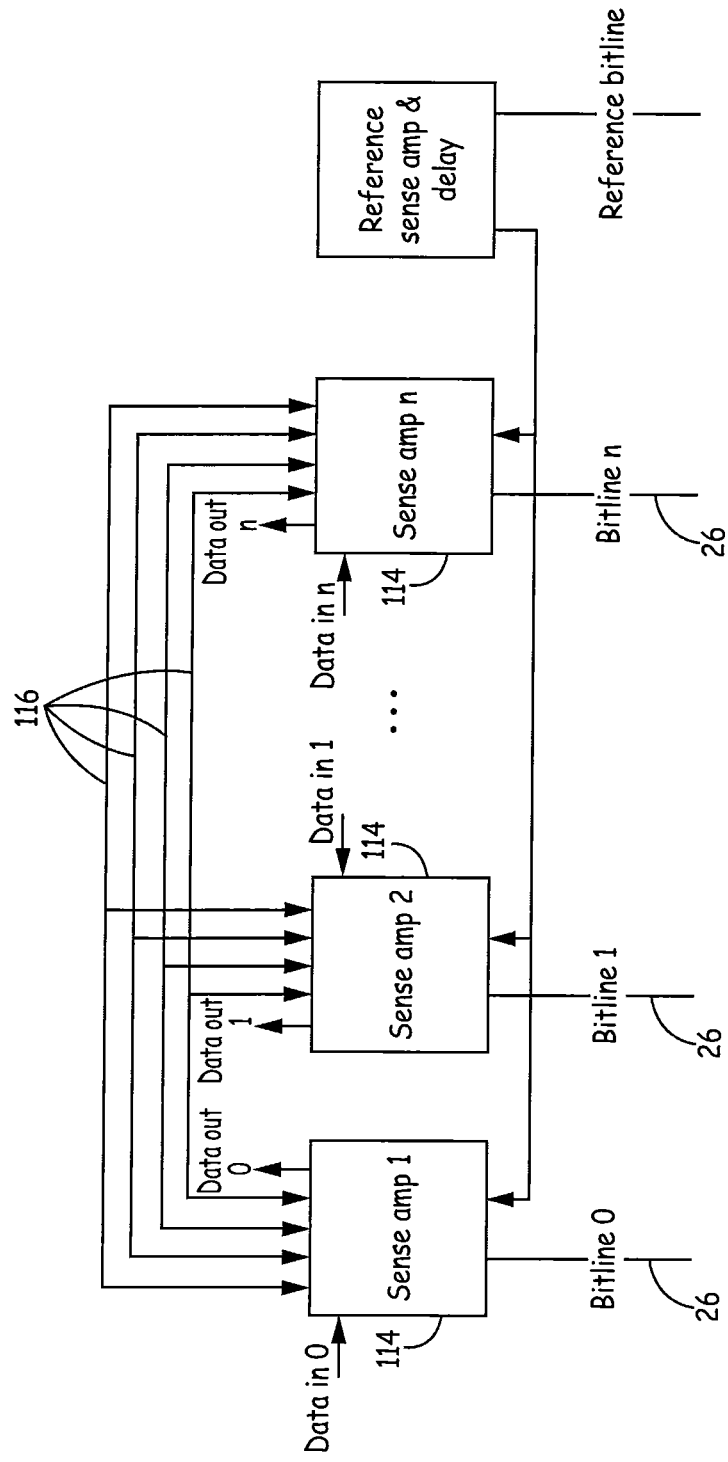
FIG. 10 is block diagram of a sensing circuit.

FIG. 10 is a block diagram of sensing circuit 54. Sense amplifiers 114 are connected to selected bitlines 26 through multiplexing provided by column multiplexors 52 and 52' (not shown in FIG. 10), i.e., one sense amp connected to each selected cell 10, 30 in line 24, 44, respectively. In an embodiment, twenty-two cells 10 or 30 in each line 24 or 44, respectively, results in twenty-two sense amplifiers 114 selected by column decode block 56 and multiplexors 52 and 52'. Lines 116 provide control signals and bias current for margin bias circuit 96 and pull-up circuit 98 to pre-charge each bitline 26, provide read operations and margin testing. In an embodiment, latch 92, inverter 94, margin bias circuit 96 and pull-up circuit 98 are components of sensing circuit 54.

Under certain circumstances, transients on bitlines 26 may show up as noise on other bitlines 26. Such noise may interfere with the ability of sense amplifier 114 to detect the data stored in a cell 10, 30 selected for reading. Sense amplifiers may incorporate pre-discharge circuitry to address such an issue. Upon a particular cell 10, 30 having been selected to be read, bitlines 26 not corresponding to the particular cell 10, 30 to be read may be driven to a predetermined state. In an embodiment, circuitry of sensing circuit 54 and column multiplexors 52 and 52' provide pre-discharge of unselected bitlines 26. Pre-discharge circuits of sense amplifiers 114 and multiplexors 52 and 52' may be configured to drive bitlines 26 not related to the particular cell 10, to be read to ground before reading the selected cell 10, 30. In so doing, transients on the bitlines 26 not corresponding to the selected cell 10, 30 may be avoided and, as a result, noise on the bitline 26 of the selected cell 10, 30 may be reduced.

Figure 11:
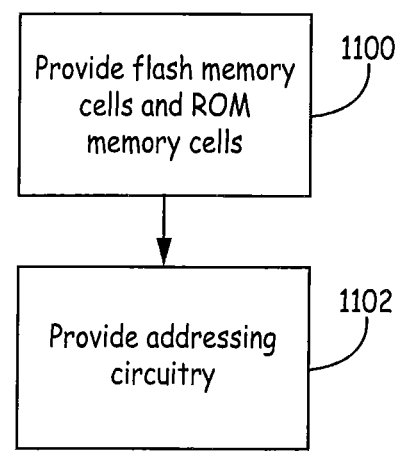
FIG. 11 is a flowchart for providing a memory array.

FIG. 11 is a flowchart for providing a memory array such as memory module 50. A plurality of flash memory cells 10 and ROM memory cells 30 are provided (1100) on memory module 50. In an embodiment, flash memory cells 10 and ROM memory cells 30 are fabricated on one or more silicon dies as known in the art. In an embodiment, at least some of flash memory cells 10 and at least some ROM memory cells 30 are fabricated on the same silicon die. Addressing circuitry, including at least column decode block 56 and row decoder 70, are provided (1102). In an embodiment, at least some of the addressing circuitry is provided on the same silicon die as the at least some flash memory cells 10 and ROM memory cells 30.

Figure 12:
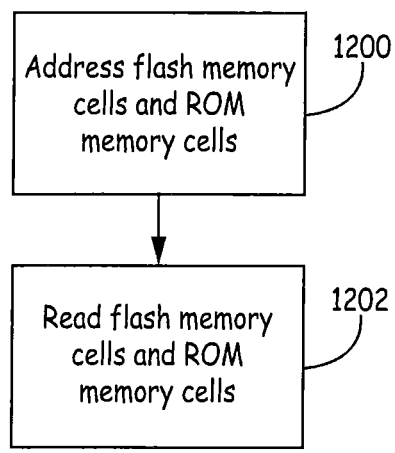
FIG. 12 is a flowchart for using a memory array.

FIG. 12 is a flowchart for using a memory array such as memory module 50. Addressing circuitry as described above is utilized to address (1200) both flash memory cells 10 and ROM memory cells 30. Reading circuitry, including at least sensing circuit 54, reads (1202) both flash memory cells 10 and ROM memory cells 30.

Figure 13A:
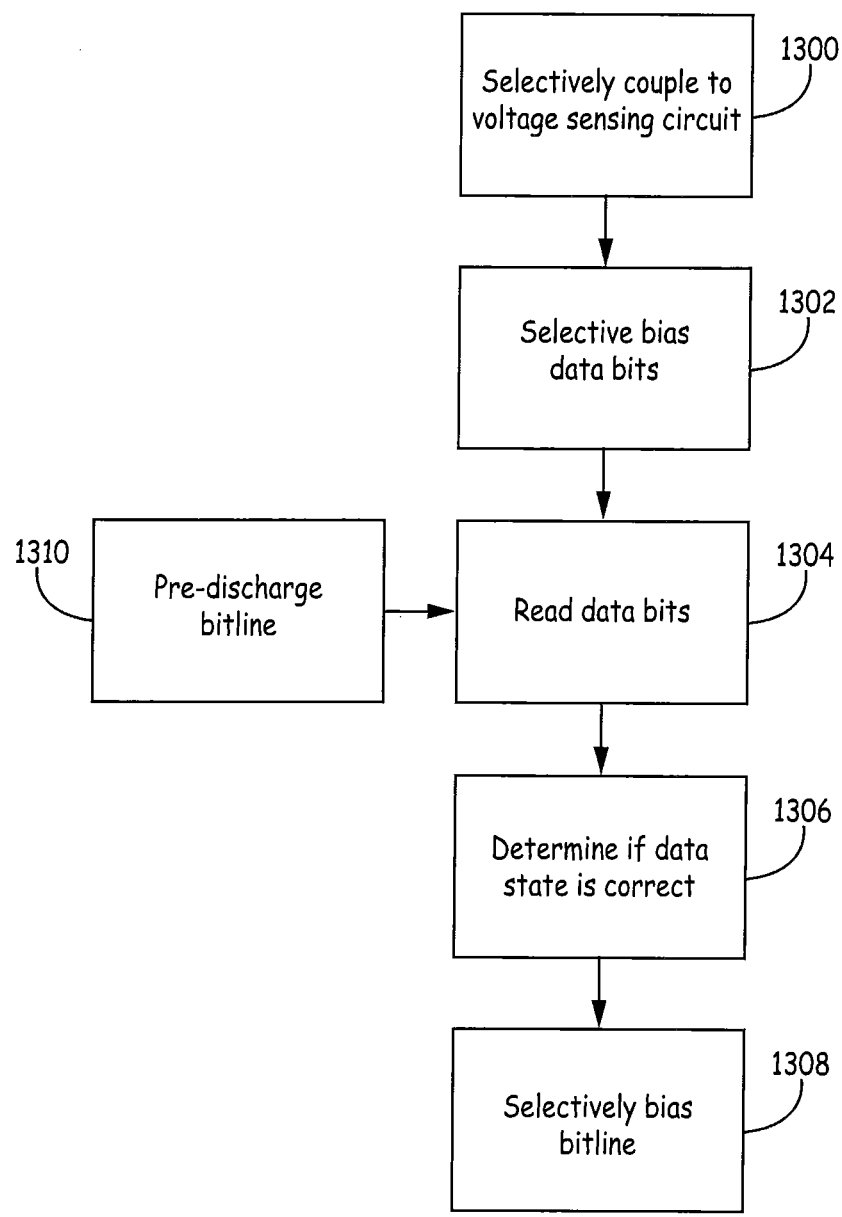
FIGS. 13a and 13b are flowcharts for operating a memory array or module.

FIG. 13a is a flowchart for operating a memory module such as memory module 50. Individual data bits such as memory cells 10, 30 are selectively coupled (1300) to a voltage sensing circuit such as sensing circuits 54. Individual ones of the data bits are selective biased (1302) by at least margin bias circuit 96 and pull-up circuit 98. The data state of the data bit is read (1304) based, at least in part, on a voltage of or imparted by the individual one of the plurality of data bits. If the reading (1304) is a margin test, it is determined (1306) whether the voltage corresponds to a correct data state. The margin test may be a margin high test, i.e., a margin "1" test, or a margin low test, i.e., a margin "0" test as detailed above. Margin bias circuit 96 is utilized to selectively bias (1308) the selected data bit. Bitline 26 not corresponding to the data bit may be pre-discharged (1310) prior to reading (1304) the data bit and, in an embodiment, each bitline 26 not corresponding to the data bit is pre-discharged prior to reading (1304) the data bit.

Figure 13B:
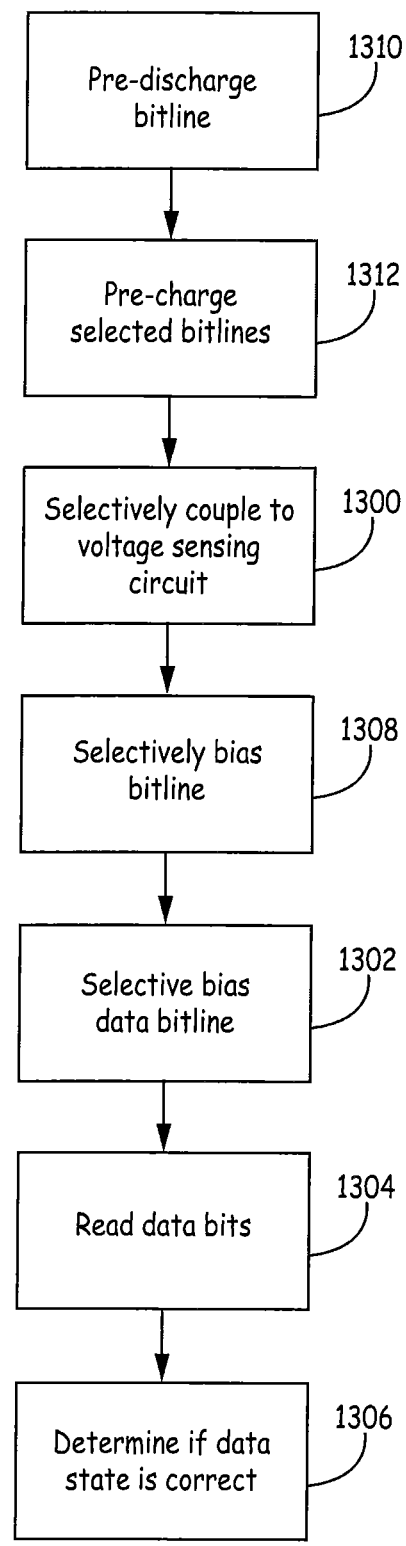

FIG. 13b is an alternative flowchart utilizing essentially the same steps as illustrated in FIG. 13a but which specifies a particular order for the steps of FIG. 13a, as well as the additional step of pre-charging (1312) selected bitlines 26.

Thus, embodiments of the memory array with flash memory cells and ROM memory cells and methods are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. An electrically erasable flash memory, comprising:
   a plurality of data storage elements configured to store a plurality of data bits, each of said plurality of data bits having a data state;
   a reference storage element in addition to said plurality of storage elements configured to store a reference; and
   a voltage sensing circuit selectively coupled to individual ones of said plurality data storage elements and said reference storage element and said voltage sensing circuit being configured to bias said individual ones of said plurality of data storage elements and said reference storage element with a bias resistance and to read said data state of said individual ones of said plurality of data bits stored in said plurality of data storage elements;
   wherein an output of said reference from said reference storage element provides an indication that data read out from said plurality of storage elements is valid;
   wherein each of said plurality of data storage elements has a performance margin;
   wherein said voltage sensing circuit is configured to selectively bias said plurality of data storage elements with said bias being at least one of a read bias and a margin bias; and
   wherein, when said voltage sensing circuit biases said individual one of said plurality of data storage elements with said margin bias, said individual one of said plurality of data storage elements induces a response indicative of said performance margin of said individual one of said plurality of data storage elements.

2. The memory of claim 1 wherein said voltage sensing circuit comprises:
   a sensor; and a biasing circuit configured to bias said sensor with said bias resistance;
wherein each of said plurality of data storage elements induces a response in said sensor indicative of said data state of a selected one of said plurality of data storage elements.

3. The memory of claim 1 wherein said voltage sensing circuit comprises:
a sensor; and
a biasing circuit configured to bias said sensor with said bias current;
wherein each of said plurality of data storage elements induces a response in said sensor indicative of said data state of a selected one of said plurality of data storage elements based, at least in part, on said indication from said reference storage element that data read out is valid.

4. The memory of claim 3:
wherein each of said plurality of data storage elements has a performance margin;
wherein said biasing circuit is configured to selectively bias said sensor with said bias current being at least one of a read bias and a margin bias; and
wherein, when said biasing circuit biases said sensor with said margin bias, said individual one of said plurality of data storage elements induces a response in said sensor indicative of said performance margin of said individual one of said plurality of data storage elements.

5. The memory of claim 4 wherein said plurality of data bits comprise binary data bits having two data states.

6. The memory of claim 5:
wherein said biasing circuit is configured to selectively bias said sensor with said margin bias being one of a margin high voltage and a margin low voltage;
wherein, when one of said plurality of data bits is stored in a first of said two data states and said biasing circuit is configured with said margin high voltage, said sensor is indicative of said performance margin of said one of said plurality of data storage elements for data stored in said first of said two data states; and
wherein, when one of said plurality of data bits is stored in a second of said two data states and said biasing circuit is configured with said margin low voltage, said sensor is indicative of said performance margin of said one of said plurality of data storage elements for data stored in said second of said two data states.

7. The memory of claim 5:
wherein said biasing circuit is configured to selectively bias said sensor with said margin bias being one of a margin zero bias and a margin one bias;
wherein, when one of said plurality of data bits is stored in a first of said two data states and said biasing circuit is configured with said margin zero bias, said sensor is indicative of said performance margin of said one of said plurality of data storage elements for data stored in said first of said two data states; and
wherein, when one of said plurality of data bits is stored in a second of said two data states and said biasing circuit is configured with said margin one bias, said sensor is indicative of said performance margin of said one of said plurality of data storage elements for data stored in said second of said two data states.

8. The memory of claim 1:
wherein said plurality of data storage elements are organized into a plurality of bitlines; and
wherein said memory further comprises a pre-discharge circuit operatively coupled to said plurality of bitlines;
wherein said pre-discharge circuit is configured to drive at least one of said plurality of bitlines to a predetermined voltage level prior to said individual one of said plurality of data storage elements inducing said response indicative of said data state in said individual one of said plurality of data bits.

9. The memory of claim 8 wherein each of said plurality of bitlines not corresponding to said individual one of said plurality of data storage elements is driven to said predetermined voltage level.

10. The memory of claim 9 wherein said predetermined voltage level is a reference voltage of at least a portion of said memory.

11. A memory module, comprising:
a flash memory cell operatively coupled to a voltage reference and configured to sink a relatively high amount of current in a first state and a relatively low amount of current in a second state different from said first state;
a reference memory cell in addition to said flash memory cell configured to store a reference;
a bias circuit operatively coupled between a voltage supply and said flash memory cell and said reference memory cell and said bias circuit being configured to form a sensing node between said bias circuit and said flash memory cell and said reference memory cell; and
a sensing circuit operatively coupled to said sensing node configured to voltage bias said flash memory cell with a bias and to read said data state of said flash memory cell based, at least in part, on said bias;
wherein an output of said reference from said reference memory cell provides an indication when to read said data state of said flash memory cell;
wherein said flash memory cell has a performance margin;
wherein said sensing circuit is configured to selectively bias said flash memory cell with said bias being at least one of a read bias and a margin bias; and
wherein, when said sensing circuit biases said flash memory cell with said margin bias, said flash memory cell induces a response indicative of said performance margin of said flash memory cell.

12. The memory module of claim 11 wherein said bias circuit induces a bias resistance on said sensing node and wherein said flash memory cell induces a response in said sensor indicative of said data state of said flash memory cell.

13. The memory module of claim 11 wherein said bias circuit induces a bias current on said sensing node and wherein said memory cell induces a response in said sensor indicative of a data state said flash memory cell.

14. The memory module of claim 13:
wherein said flash memory cell has a performance margin;
wherein said biasing circuit is configured to selectively bias said sensor with said bias current being at least one of a read bias and a margin bias; and
wherein, when said biasing circuit biases said sensor with said margin bias, said flash memory cell induces a response in said sensor indicative of said performance margin of said flash memory cell.

15. The memory module of claim 14 wherein said flash memory cell comprises binary data bits having two data states.

16. The memory module of claim 15:
wherein said biasing circuit is configured to selectively bias said sensor with said margin bias being one of a margin high voltage and a margin low voltage;

wherein, when said flash memory cell is stored in a first of said two data states and said biasing circuit is configured with said margin high voltage, said sensor is indicative of said performance margin of said flash memory cell for data stored in said first of said two data states; and wherein, when said flash memory cell is stored in a second of said two data states and said biasing circuit is configured with said margin low voltage, said sensor is indicative of said performance margin of said flash memory cell for data stored in said second of said two data states.

17. The memory module of claim 15:

wherein said biasing circuit is configured to selectively bias said sensor with said margin bias being one of a margin zero bias and a margin one bias;

wherein, when said flash memory cell is stored in a first of said two data states and said biasing circuit is configured with said margin zero bias, said sensor is indicative of said performance margin of said flash memory cell for data stored in said first of said two data states; and wherein, when said flash memory cell is stored in a second of said two data states and said biasing circuit is configured with said margin one bias, said sensor is indicative of said performance margin of said flash memory cell for data stored in said second of said two data states.

18. The memory module of claim 11 further comprising a plurality of flash memory cells operatively coupled to said bias circuit and said sensing circuit:

wherein said plurality of flash memory cell is organized into a plurality of bitlines; and wherein said memory further comprises a pre-discharge circuit operatively coupled to said plurality of bitlines;

wherein said pre-discharge circuit is configured to drive at least one of said plurality of bitlines to a predetermined voltage level prior to one of said plurality of flash memory cells inducing said response indicative of said data state in said flash memory cell.

19. The memory module of claim 18 wherein each of said plurality of bitlines not corresponding to said one of said plurality of flash memory cells is driven to said predetermined voltage level.

20. The memory module of claim 19 wherein said predetermined voltage level is a reference voltage of at least a portion of said memory.

21. A method of operating an electrically erasable flash memory having a plurality of data storage elements configured to store a plurality of data bits, each of said plurality of data bits having a data state, a reference storage element in addition to said plurality of data storage elements to store a reference and a voltage sensing circuit, comprising the steps of:

selectively coupling individual ones of said plurality data storage elements and said reference storage element to said voltage sensing circuit;

biasing said individual ones of said plurality of data storage elements with a bias; and then reading said data state of said individual ones of said plurality of data storage elements when said reference output from said reference storage element is valid and based, at least in part, on a voltage of said individual ones of said plurality of data bits stored in said plurality of data storage elements;

wherein each individual one of said plurality of data storage elements has a performance margin;

wherein said bias is one of a read bias voltage and a margin bias voltage;

wherein said biasing step, for a normal read, selectively biases said plurality of data storage elements to said read bias to determine said data state of said individual one of said plurality of data storage elements;

wherein said biasing step, for a performance margin test, selectively biases said plurality of data storage elements to said margin bias to determine said performance margin of said individual one of said plurality of data storage elements;

further comprising the step of determining whether or not said data state read from said plurality of data storage elements for said performance margin test is a correct data state.

22. The method of claim 21 wherein said biasing step comprises coupling a resistance bias to said individual ones of said plurality of data storage elements to detect a margin high of said individual ones of said plurality of data storage elements.

23. The method of claim 21 wherein said biasing step comprises coupling a resistance bias and a current bias to said individual ones of said plurality of data storage elements to detect a margin low of said individual ones of said plurality of data storage elements.

24. The method of claim 21 wherein said plurality of data bits comprise binary data bits having two data states.

25. The method of claim 24:

selectively biasing said sensor with said margin bias being one of a margin high bias and a margin low bias;

wherein, when one of said plurality of data bits is stored in a first of said two data states and said biasing circuit is configured with said margin high bias, said sensor is indicative of said performance margin of said one of said plurality of data bits for data stored in said first of said two data states; and wherein, when one of said plurality of data bits is stored in a second of said two data states and said biasing circuit is configured with said margin low voltage, said sensor is indicative of said performance margin of said one of said plurality of data bits for data stored in said second of said two data states.

26. The method of claim 21:

wherein said plurality of data storage elements are organized into a plurality of bitlines; and wherein said memory further comprises a pre-discharge circuit operatively coupled to said plurality of bitlines;

further comprising the step of driving, with said pre-discharge circuit, at least one of said plurality of bitlines to a predetermined voltage level prior to said individual one of said plurality of data storage elements inducing said response indicative of said data state in said individual one of said plurality of data storage elements.

27. The method of claim 26 further comprising the step of driving each of said plurality of bitlines not corresponding to said individual one of said plurality of data storage elements to said predetermined voltage level.

28. The method of claim 27 wherein said predetermined voltage level is a reference voltage of at least a portion of said memory.

\* \* \* \* \*